United States Patent
You et al.

(10) Patent No.: US 9,933,870 B2
(45) Date of Patent: Apr. 3, 2018

(54) BACK PLATE MEMBER FOR FLEXIBLE DISPLAY, DISPLAY APPARATUS INCLUDING THE SAME, AND METHOD OF MANUFACTURING THE SAME

(71) Applicant: LG Display Co., Ltd., Seoul (KR)

(72) Inventors: Koohan You, Seoul (KR); JunSeok Lee, Incheon (KR); JongUk Park, Daegu (KR); TaeChul Lim, Anyang-si (KR); JiYong Jeong, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 78 days.

(21) Appl. No.: 14/979,517

(22) Filed: Dec. 28, 2015

(65) Prior Publication Data

US 2016/0275830 A1    Sep. 22, 2016

Related U.S. Application Data

(60) Provisional application No. 62/134,471, filed on Mar. 17, 2015.

(30) Foreign Application Priority Data

Dec. 1, 2015   (KR) ........................ 10-2015-0170168

(51) Int. Cl.
  *G06F 3/041*   (2006.01)
  *G02F 1/1333*  (2006.01)
  (Continued)

(52) U.S. Cl.
  CPC ........ *G06F 3/041* (2013.01); *G02F 1/133305* (2013.01); *G02F 2001/133354* (2013.01);
  (Continued)

(58) Field of Classification Search
  CPC ............ H01L 51/0097; H01L 51/5253; G06F 2203/04102; G06F 2203/04103; G06F 1/1652; G06F 3/041; G06F 3/044; G02F 2001/133354; G02F 1/133305; G02F 1/133308; G09F 9/301; G09F 9/302; G09F 9/33; G09F 9/35
  See application file for complete search history.

(56) References Cited

U.S. PATENT DOCUMENTS 7,369,209 B2 *  5/2008  Kinoshita .........  G02F 1/133305
                                                  349/158
9,209,207 B2 * 12/2015  Park ....................  H01L 27/1259
(Continued)

*Primary Examiner* — Ilana L Spar
*Assistant Examiner* — Darlene Ritchie
(74) *Attorney, Agent, or Firm* — Fenwick & West LLP

(57) ABSTRACT

Disclosed are a back plate member for flexible display, a display apparatus including the same, and a method of manufacturing the same, in which a bonding process of bonding a cover glass to a flexible display panel is easily performed. The back plate member includes a back plate including first and second supporting plates which are arranged in parallel with an open part therebetween, a first protective film including a first protection part attached to a bottom of the first supporting plate, a second protection part attached to a bottom of the second supporting plate, and a separation part overlapping the open part, and a second protective film attached to a top of the back plate, the second protective film having a plate shape.

14 Claims, 16 Drawing Sheets

(51) Int. Cl.
   *G06F 1/16*     (2006.01)
   *H01L 51/00*    (2006.01)
   *G06F 3/044*    (2006.01)

(52) U.S. Cl.
   CPC ............ *G06F 1/1652* (2013.01); *G06F 3/044* (2013.01); *G06F 2203/04102* (2013.01); *G06F 2203/04103* (2013.01); *H01L 51/0097* (2013.01)

(56) References Cited

U.S. PATENT DOCUMENTS

| | | | | |
|---|---|---|---|---|
| 9,321,677 | B2* | 4/2016 | Chang | C03C 21/002 |
| 9,614,168 | B2* | 4/2017 | Zhang | H01L 23/4985 |
| 2003/0134488 | A1* | 7/2003 | Yamazaki | G02F 1/133305 |
| | | | | 438/455 |
| 2009/0151988 | A1* | 6/2009 | Lee | H05K 1/0218 |
| | | | | 174/254 |
| 2009/0290113 | A1* | 11/2009 | Nakahata | B32B 38/1866 |
| | | | | 349/138 |
| 2010/0296027 | A1* | 11/2010 | Matsuhira | G02F 1/133308 |
| | | | | 349/96 |
| 2012/0020056 | A1* | 1/2012 | Yamagata | G02F 1/133308 |
| | | | | 362/97.1 |
| 2012/0162099 | A1* | 6/2012 | Yoo | G06F 3/0412 |
| | | | | 345/173 |
| 2013/0002133 | A1* | 1/2013 | Jin | H01L 51/524 |
| | | | | 313/511 |
| 2013/0002583 | A1* | 1/2013 | Jin | G06F 1/1637 |
| | | | | 345/173 |
| 2013/0037228 | A1* | 2/2013 | Verschoor | G06F 1/1652 |
| | | | | 160/377 |
| 2013/0056243 | A1* | 3/2013 | Kim | H05K 1/0289 |
| | | | | 174/250 |
| 2013/0081756 | A1* | 4/2013 | Franklin | B29C 53/04 |
| | | | | 156/221 |
| 2014/0042406 | A1* | 2/2014 | Degner | H01L 27/326 |
| | | | | 257/40 |
| 2014/0126228 | A1* | 5/2014 | Lee | H05K 5/0017 |
| | | | | 362/382 |
| 2014/0204285 | A1* | 7/2014 | Jang | G06F 3/044 |
| | | | | 349/12 |
| 2014/0354558 | A1* | 12/2014 | Cho | G06F 3/0412 |
| | | | | 345/173 |
| 2014/0367644 | A1* | 12/2014 | Song | H01L 51/0097 |
| | | | | 257/40 |
| 2015/0102298 | A1* | 4/2015 | Namkung | H01L 51/0097 |
| | | | | 257/40 |
| 2015/0130777 | A1* | 5/2015 | Park | G09G 3/2085 |
| | | | | 345/206 |
| 2015/0153862 | A1* | 6/2015 | Nakamura | G06F 3/041 |
| | | | | 345/173 |
| 2015/0177789 | A1* | 6/2015 | Jinbo | G06F 1/1652 |
| | | | | 313/511 |
| 2015/0316810 | A1* | 11/2015 | Shibahara | G02F 1/1333 |
| | | | | 349/150 |
| 2016/0007441 | A1* | 1/2016 | Matsueda | G06F 1/1652 |
| | | | | 361/749 |
| 2016/0011628 | A1* | 1/2016 | Sato | G06F 1/1656 |
| | | | | 361/679.3 |
| 2016/0062412 | A1* | 3/2016 | Park | G06F 1/1616 |
| | | | | 361/679.27 |
| 2016/0081180 | A1* | 3/2016 | Huitema | H01L 51/0097 |
| | | | | 361/749 |
| 2016/0211484 | A1* | 7/2016 | Naijo | H01L 51/5259 |
| 2016/0218305 | A1* | 7/2016 | Kim | G02F 1/133305 |
| 2017/0062742 | A1* | 3/2017 | Kim | H01L 51/0097 |

* cited by examiner

BACK PLATE MEMBER FOR FLEXIBLE DISPLAY, DISPLAY APPARATUS INCLUDING THE SAME, AND METHOD OF MANUFACTURING THE SAME

CROSS-REFERENCE TO RELATED APPLICATIONS

This application claims the benefit of U.S. Provisional Application No. 62/134,471, filed on Mar. 17, 2015, and Republic of Korea Patent Application No. 10-2015-0170168, filed on Dec. 1, 2015, which are hereby incorporated by reference as if fully set forth herein.

BACKGROUND

Field of the Invention

The present invention relates to a display apparatus, and more particularly, to a back plate member for flexible display, a display apparatus including the same, and a method of manufacturing the same, in which a bonding process of bonding a cover glass to a flexible display panel is easily performed.

Discussion of the Related Art

Generally, display apparatuses are being widely used as display screens of various products such as televisions (TVs), notebook computers, monitors, and/or the like, in addition to portable electronic devices such as mobile communication terminals, electronic notes, e-books, portable multimedia players (PMPs), navigation devices, ultra-mobile personal computers (PCs), mobile phones, smartphones, tablet PCs, and watch phones.

In display apparatuses, organic light emitting display apparatuses and electrophoresis display apparatuses can be thinned, and thus, research and development for implementing the organic light emitting display apparatuses and the electrophoresis display apparatuses as flexible display apparatuses are being done. In the flexible display apparatuses, a wiring and a display unit including a thin film transistor (TFT) are formed on a flexible substrate with flexibility. The flexible display apparatuses may display an image even when being bent like paper, and thus may be applied to various display fields.

FIG. 1 is a diagram for describing a related art display apparatus. Referring to FIG. 1, the related art display apparatus includes a cover window 10, a flexible display panel 20, and a panel driving circuit unit 30. The cover window 10 covers a front surface and both side surfaces of the flexible display panel 20. To this end, the cover window 10 includes a front part 11 and a side wall 12. The side wall 12 of the cover window 10 is vertically bent from both side edges of the front part 11 to surround the both side surfaces of the flexible display panel 20.

The flexible display panel 20 is bonded to a bottom of the cover window 10 by a direct bonding process using a transparent adhesive 50. The flexible display panel 20 includes a pixel array part 23 provided on a flexible substrate 21 formed of a flexible material. Also, the flexible display panel 20 includes a pad part (not shown) which is provided at one side edge of the flexible substrate 23 and is connected to the pixel array part 23. A plurality of link lines (not shown) which connect the pad part to the pixel array part 23 are provided on the flexible substrate 21 between the pixel array part 23 and the pad part.

A back plate 40 is attached to a whole bottom of the flexible display panel 20. The back plate 40 maintains the flexible display panel 20 in a flat state.

The panel driving circuit unit 30 is connected to the pad part provided at the one side edge of the flexible display panel 20.

One side edge of the flexible display panel 20 is bent to have a curvature part RP having a certain curvature and thus is covered by the cover window 10. Therefore, the panel driving circuit 30 is disposed on a side surface or a bottom of the flexible display panel 20, and thus, the related art display apparatus has a thin bezel width.

In a method of manufacturing the related art display apparatus, the flexible display panel 20 is attached to a bottom of the cover window 10 through a lamination process, and then, one side edge of the flexible substrate 21 connected to the panel driving circuit unit 30 is bent at a certain curvature along with the back plate 40.

However, in the related art display apparatus, a bending stress which occurs in a bending area of the back plate 40 is transferred to a bending area of the flexible substrate 21 when the flexible display panel 20 is bent, and for this reason, a crack occurs in a link line which is provided in the bending area of the flexible substrate 21.

Moreover, in the related art display apparatus, as illustrated in FIG. 2, when the flexible display panel 20 is attached to a bottom of the cover window 10, the panel driving circuit unit 30 is damaged due to interference or contact between a side wall 12 of the cover window 10 and a portion of the panel driving circuit unit 30 and/or one side edge of the flexible display panel 20, and it is difficult to bond the flexible display panel 20 to the cover window 10 due to misalignment which occurs between the cover window 10 and the flexible display panel 20.

Information disclosed in this Background section was already known to the inventors of the inventive concept before achieving the present invention or is technical information acquired in the process of achieving the present invention. Therefore, it may contain information that does not form the prior art that is already known to the public in this country.

SUMMARY

Accordingly, the present invention is directed to provide a back plate member for flexible display, a display apparatus including the same, and a method of manufacturing the same that substantially obviate one or more problems due to limitations and disadvantages of the related art.

An aspect of the present invention is directed to provide a back plate member for flexible display, a display apparatus including the same, and a method of manufacturing the same, in which a bonding process of bonding a cover glass to a flexible display panel is easily performed.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a back plate member for flexible apparatus including a back plate including a first supporting plate and a second supporting plate parallel to the first supporting plate and separated first supporting plate by an open part, a first protective film including a first protection part attached to a bottom of the first supporting plate, a second protection part attached to a bottom of the second supporting plate, and a separation part overlapping the open part, and a second protective film attached to a top of the back plate, the second protective film having a plate shape.

In another aspect of the present invention, there is provided a display apparatus including: a cover window including a front part and a side wall provided on each of both sides of the front part, a flexible display panel including a pixel array part bonded to a bottom of the front part of the cover window, a pad part connected to the pixel array part, and a bending part between the pixel array part and the pad part, a panel driving circuit unit connected to the pad part, and a back plate including a first supporting plate supporting the pixel array part, a second supporting plate supporting the pad part, and an open part overlapping the bending part.

In another aspect of the present invention, there is provided a method of manufacturing a display apparatus including providing a flexible display panel which includes a pixel array part, a pad part connected to the pixel array part, and a bending part between the pixel array part and the pad part, providing a back plate member which includes a back plate which includes a first supporting plate supporting the pixel array part, a second supporting plate supporting the pad part, and an open part overlapping the bending part, a first protective film which includes a separation part overlapping the open part and is attached to a bottom of the back plate, and a second protective film which is attached to a top of the back plate and has a plate shape, providing a cover window which includes a front part and a side wall provided on each of both sides of the front part, stripping the second protective film from the back plate member and bonding a bottom of the flexible display panel to a top of the back plate, pre-bending a bending part of the flexible display panel, bonding the pixel array part of the flexible display panel to the front part of the cover window in a state where the bending part of the flexible display panel is pre-bent, stripping the first protective film from the back plate member, and additionally bending the bending part of the flexible display panel.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Figure 1:
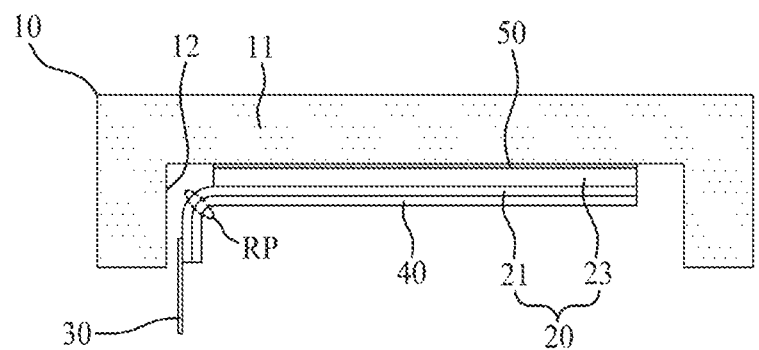
FIG. 1 is a diagram for describing a related art display apparatus.
Figure 2:
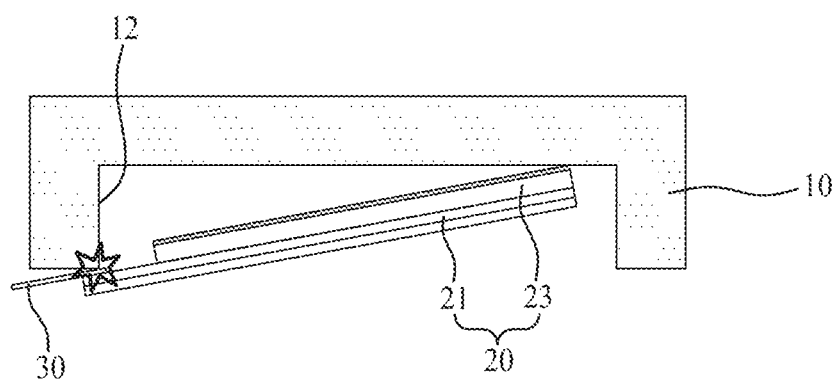
FIG. 2 is a diagram for describing interference between a panel driving circuit unit and a cover window in the related art display apparatus.

Reference will now be made in detail to the exemplary embodiments of the present invention, examples of which are illustrated in the accompanying drawings. Wherever possible, the same reference numbers will be used throughout the drawings to refer to the same or like parts.

The terms described in the specification should be understood as follows.

The terms described in the specification should be understood as follows. As used herein, the singular forms "a", "an" and "the" are intended to include the plural forms as well, unless the context clearly indicates otherwise. The terms "first" and "second" are for differentiating one element from the other element, and these elements should not be limited by these terms. It will be further understood that the terms "comprises", "comprising,", "has", "having", "includes" and/or "including", when used herein, specify the presence of stated features, integers, steps, operations, elements, and/or components, but do not preclude the presence or addition of one or more other features, integers, steps, operations, elements, components, and/or groups thereof. The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item. The term "on" should be construed as including a case where one element is formed at a top of another element and moreover a case where a third element is disposed therebetween.

Hereinafter, exemplary embodiments of a back plate for display and a method of manufacturing the same according to the present invention will be described in detail with reference to the accompanying drawings. In the specification, in adding reference numerals for elements in each drawing, it should be noted that like reference numerals already used to denote like elements in other drawings are used for elements wherever possible. In the following description, when the detailed description of the relevant known function or configuration is determined to unnecessarily obscure the important point of the present invention, the detailed description will be omitted.

Figure 3:
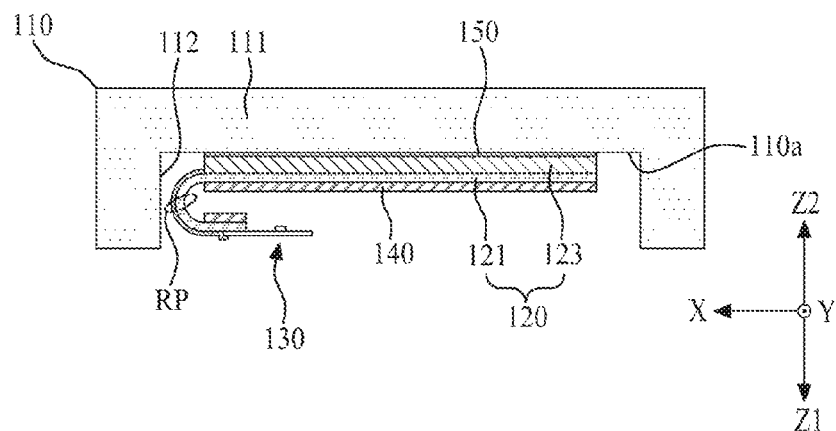
FIG. 3 is a cross-sectional view for describing a display apparatus according to a first embodiment of the present invention.
Figure 4:
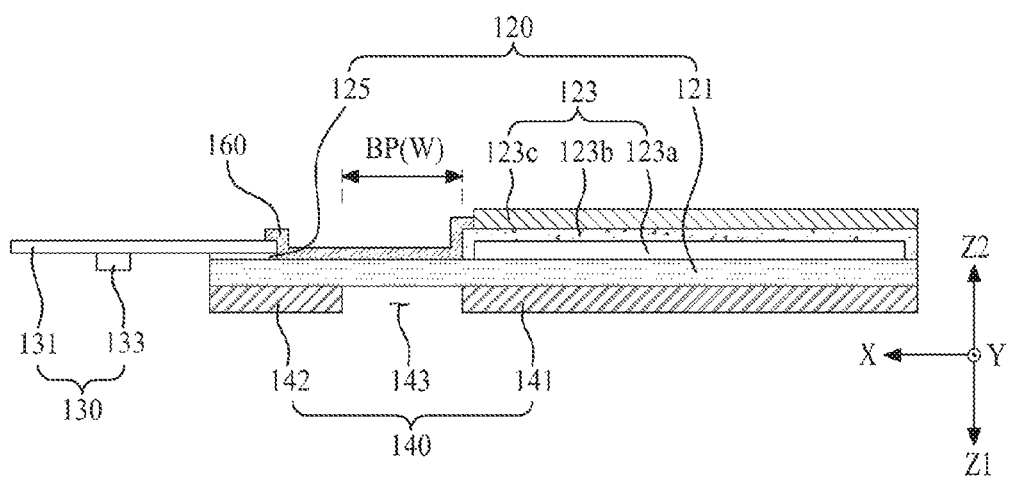
FIG. 4 is a cross-sectional view illustrating a back plate, a flexible display panel, and a panel driving circuit unit illustrated in FIG. 3.

FIG. 3 is a cross-sectional view for describing a display apparatus 100 according to a first embodiment of the present invention, and FIG. 4 is a cross-sectional view illustrating a back plate, a flexible display panel, and a panel driving circuit unit illustrated in FIG. 3.

Referring to FIGS. 3 and 4, the display apparatus 100 according to the first embodiment of the present invention may include a cover window 110, a flexible display panel 120, a panel driving circuit unit 130, and a back plate 140.

The cover window 110 may cover a front surface and a side surface of the flexible display panel 130. The cover window 110 according to an embodiment may include a front part 111 and a side wall 112, and for example, may have a cap shape. The front part 111 may be formed in a planar shape and may cover the front surface of the flexible display panel 130. The side wall 112 may be bent in a direction Z1 from both side edges to a bottom of the front part 111 and may cover the side surface of the flexible display panel 130.

The cover window 110 protects the flexible display panel 130 from an external impact. To this end, the cover window 110 according to an embodiment may include at least one of sapphire glass and gorilla glass. A cover window 580 according to another embodiment may include one of polyethyleneterephthalate (PET), polycarbonate (PC), polyethersulfone (PES), polyethylenapthanate (PEN), and polynorborneen (PNB). The cover window 110 may be formed of tempered glass in consideration of scratch and transparency.

The flexible display panel 120 may be a display panel of a flexible flat panel display apparatus. In the following description, the flexible display panel 120 is assumed as a flexible organic light emitting display panel of a flexible flat panel display apparatus.

The flexible display panel 120 according to an embodiment may include a flexible substrate 121, a pixel array part 123, a pad part 125, and a bending part BP.

The flexible substrate 121 may include a flexible plastic material, for example, poly carbonate, poly methylpentene, poly methyl methacrylate, cycloolefin copolymer, polyimide, or the like. In detail, the flexible substrate 121 may include opaque or colored polyimide. The flexible substrate 121 according to an embodiment may be formed by curing a plastic material which is coated on a top of a release layer, formed on a relatively thick carrier substrate (not shown), to a certain thickness, The pixel array part 123 may be provided on the flexible substrate 121 and may display an image. The pixel array part 123 according to an embodiment may include a pixel array layer 123a, an encapsulation layer 123b, and a barrier layer 123c.

The pixel array layer 123a may include a plurality of pixels which are respectively provided in a plurality of pixel areas defined by a plurality of signal lines provided on the flexible substrate 21 and display an image according to signals supplied through the signal lines. The pixel array layer 123a according to an embodiment may include a thin film transistor (TFT), an anode electrode, an organic light emitting device, and a cathode electrode which are not shown.

The TFT may be provided in a transistor area of each of the pixels areas defined on the flexible substrate 121 and may include a gate electrode, a gate insulation layer, a semiconductor layer, a source electrode, and a drain electrode. Here, the TFT may be an amorphous silicon (a-Si) TFT, a poly-Si TFT, an oxide TFT, an organic TFT, or the like.

The anode electrode may be provided in a pattern form in an opening area defined in each of the pixels and may be connected to the TFT.

The organic light emitting device may be formed on the anode electrode provided in the opening area. Although not shown, the organic light emitting device may be formed in a structure where a hole injection layer, a hole transport layer, an organic emission layer, an electron transport layer, and an electron injection layer are sequentially stacked. Here, one or more of the hole injection layer, the hole transport layer, the electron transport layer, and the electron injection layer may be omitted. The organic emission layer may be formed to emit light having the same color (for example, white light) by pixels, or may be formed to emit lights having different colors (for example, red light, green light, or blue light) by pixels.

The cathode electrode may be connected in common to the organic light emitting device provided in each of the pixel areas.

The encapsulation layer 123b prevents moisture from penetrating into each of the pixels and may be formed to cover the pixel array layer 123a. Here, the encapsulation layer 123b may be formed in a multilayer structure where an organic material layer or an inorganic material layer, an organic material layer and an inorganic material layer are alternately stacked.

The barrier layer 123c may be provided on a top of the encapsulation layer 123b to prevent moisture from penetrating into the flexible display panel 120. The barrier layer 123c may be formed of a material (for example, a polymer material) which is low in water vapor permeability.

In addition, the flexible display panel 120 may further include a polarizing film (not shown) disposed on a top of the barrier layer 123c, instead of the barrier layer 123c.

The polarizing film may polarize light emitted from each of the pixels of the pixel array part 123 or may prevent reflection of external light, thereby enhancing an optical characteristic of the flexible display panel 120.

The pad part 125 may include a plurality of pad electrodes (not shown) which are provided at one side edge of the flexible substrate 121. Each of the pad electrodes may be connected to a signal line of the pixel array part 123 through a corresponding link line.

The bending part BP may be defined between the pad part 125 and the pixel array part 123. In order to reduce a side bezel width of the display apparatus, one side edge of the flexible display panel 120 may be bent in a curved shape, and the bending part BP may be surrounded or covered by the side wall 112 of the cover window 110.

The flexible display panel 120 may be bonded to a bottom 110a of the cover window 110 through a direct bonding process using a transparent adhesive member 150. Here, the transparent adhesive member 150 may include a pressure sensitive adhesive (PSA), an optical clear adhesive (OCA), an optical clear resin (OCR), or the like.

The panel driving circuit part 130 may be connected to the pad part 125 provided in the flexible display panel 120 and may supply, to the pad part 125, a signal for driving each of the pixels. The panel driving circuit unit 130 according to an embodiment may include a flexible circuit film 131 and a driving integrated circuit (IC) 133.

The flexible circuit film 131 may be attached to the pad part 125 of the flexible display panel 120 through a film attaching process.

The driving IC 133 may be mounted on the flexible circuit film 131 by a chip bonding process or a surface mounting process. The driving IC 133 may generate a data signal and a gate signal to display image on each of the pixels, based on video data and a timing synchronization signal supplied from an external display driving system.

Optionally, the driving IC 133 may not be mounted on the flexible circuit film 131 but may be built into the display driving system. In this case, the flexible circuit film 131 may transfer a signal between the pad part 125 and the display driving system.

The back plate 140 may be attached to a bottom other than the bending part BP of the flexible display panel 120 and may support the flexible display panel 120. That is, the back plate 140 may be attached to a rear surface other than the bending part BP of the flexible substrate 121 by a lamination process. The back plate 140 may maintain the pixel array part 123 of the flexible display panel 120 in a flat state and may cause the bending part BP of the flexible display panel 120 to be bent so as to have a curvature part RP having a certain curvature.

The back plate 140 according to an embodiment may include a first supporting plate 141, a second supporting plate 142, and an open part 143.

The first supporting plate 141 may be attached to a bottom of the flexible substrate 121 overlapping the pixel array part 123 of the flexible display panel 120. The first supporting plate 141 may support the pixel array part 123 of the flexible display panel 120, thereby maintaining the pixel array part 123 in a flat state.

The second supporting plate 142 may be attached to one side edge of the flexible substrate 121 overlapping the pad part 125 of the flexible display panel 120. The second supporting plate 142 may support the pad part 125 of the flexible display panel 120, thereby maintaining the pad part 125 in a flat state. A bottom of the second supporting plate 142 may be disposed to face a bottom of the first supporting plate 141 according to the flexible display panel 120 being bent.

The open part 143 may be provided between the first and second supporting plates 141 and 142 and may cause a bending area of the back plate 140 to be bent at a certain curvature. That is, the open part 143 may be provided by removing a bending area of the back plate 140 overlapping the bending part BP of the flexible display panel 120 and may expose the bottom of the flexible substrate 121, thereby enabling the back plate 140 and the bending part BP provided on the flexible substrate 121 to be bent when the flexible substrate 121 is bent. Also, the open part 143 may pre-bend the bending part BP of the flexible display panel 120. Therefore, the bending part BP of the flexible display panel 120 may be pre-bent by the open part 143 of the back plate 140, and thus, a contact between the panel driving circuit unit 130 and the cover window 110 is prevented in a bonding process of bonding the flexible display panel 120 to the cover window 110.

The open part 143 may be provided by removing a certain area (i.e., a bending area of the back plate 140) of the back plate 140 overlapping the bending part BP of the flexible display panel 120 and may have a width W corresponding to a bending curvature of the bending part BP.

In addition, the display apparatus 100 according to the first embodiment of the present invention may further include a cover layer 160 which is provided on the flexible substrate 121 to cover a space between the pixel array part 123 and the pad part 125.

The cover layer 160 may include a polymer material and may be coated on the flexible substrate 121 to cover a link line between the pixel array part 123 and the pad part 125. The cover layer 160 protects the link line from an external impact and prevents moisture from penetrating into the link line. Particularly, when the bending part BP of the flexible display panel 120 is bent at a certain curvature, the cover layer 160 may cause the link line to be disposed on a neutral plane. That is, when the bending part BP of the flexible display panel 120 is bent at a certain curvature, a neutral plane where a tensile force and a compressive force each become zero may be provided between the flexible substrate 121 and the cover layer 160. Therefore, in order for a link line provided in the bending part of the flexible display panel 120 to be disposed on a neutral plane, the cover layer 160 may include a material having an elastic coefficient higher than that of the flexible substrate 121 and may have a thickness corresponding to a thickness of the link line. Accordingly, since the link line is disposed on the neutral plane between the cover layer 160 and the flexible substrate 121, a bending stress "0(zero)" of when the bending part BP of the flexible display panel 120 is bent at a certain curvature is applied to the link line, and thus, the link line is bent without being damaged by the bending stress.

In the display apparatus 100 according to the first embodiment of the present invention, the bending part BP of the flexible display panel 120 may be bent by the open part 143 provided in the back plate 140 overlapping the bending part BP of the flexible display panel 120 and then may be attached to the bottom 110a of the cover window 110, and thus, a defect caused by a contact between the panel driving circuit unit 130 and the cover window 110 is prevented in a bonding process of bonding the flexible display panel 120 to the cover window 110.

Figure 5:
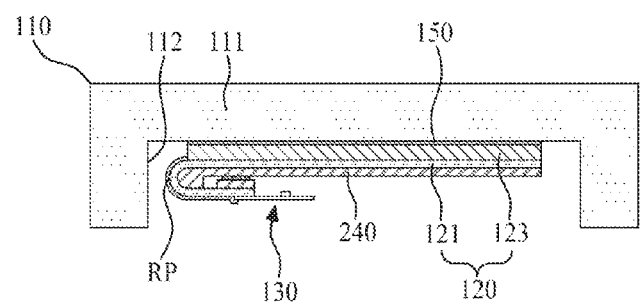
FIG. 5 is a cross-sectional view for describing a display apparatus according to a second embodiment of the present invention.
Figure 6:
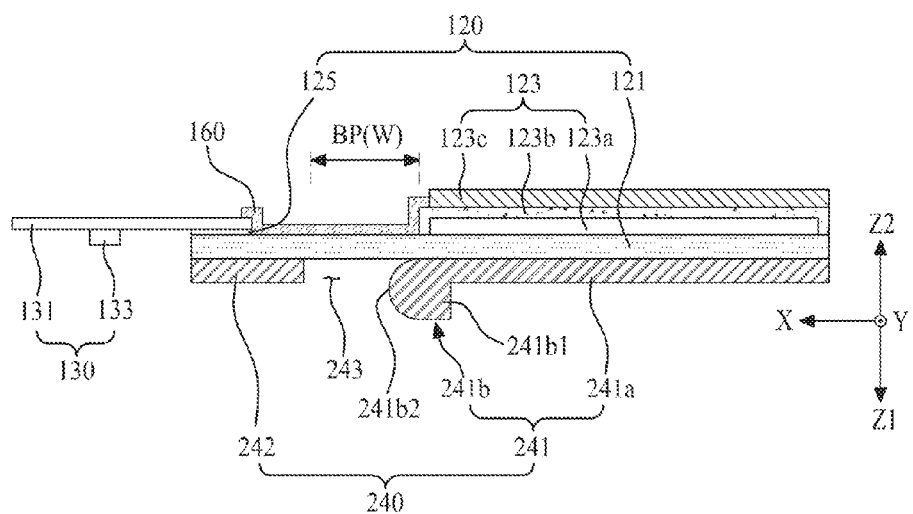
FIG. 6 is a cross-sectional view illustrating a back plate, a flexible display panel, and a panel driving circuit unit illustrated in FIG. 5.

FIG. 5 is a cross-sectional view for describing a display apparatus 200 according to a second embodiment of the present invention, and FIG. 6 is a cross-sectional view illustrating a back plate, a flexible display panel, and a panel driving circuit unit illustrated in FIG. 5.

Referring to FIGS. 5 and 6, the display apparatus 200 according to the second embodiment of the present invention may include a cover window 110, a flexible display panel 120, a panel driving circuit unit 130, and a back plate 240. In the display apparatus 200 having such a configuration, the back plate 240 may have a structure which is implemented by changing a structure of the back plate 140 of the display apparatus 100 illustrated in FIGS. 3 and 4. Hereinafter, therefore, only the back plate 240 and elements relevant thereto will be described, and descriptions of the other elements which are the same as the elements of FIG. 1 are not repeated.

The back plate 240 according to an embodiment may include a first supporting plate 241, a second supporting plate 242, and an open part 243.

The first supporting plate 241 may be attached to a bottom of the flexible substrate 121 overlapping the pixel array part 123 of the flexible display panel 120. The first supporting plate 241 may support the pixel array part 123 of the flexible display panel 120, thereby maintaining the pixel array part 123 in a flat state and guiding the bending part BP of the flexible display panel 120 to be bent at a certain curvature. The first supporting plate 241 according to an embodiment may include a panel supporting part 241a and a bending guide part 241b.

The panel supporting part 241a may be provided in a plate shape and may be attached to a bottom of the flexible substrate 121 overlapping the pixel array part 123 of the flexible display panel 120, thereby maintaining the pixel array part 123 in a flat state.

The bending guide part 241b may be provided on an inner surface of the panel supporting part 241a facing the second supporting plate 241 and may guide bending of the flexible display panel 120. The bending guide part 241b and the panel supporting part 241a may be implemented as one body, based on an injection method or an extrusion method.

The bending guide part 241b according to an embodiment may include a guide projection 241b1 and a rounding part 241b2.

The guide projection 241b1 may vertically protrude in a down direction Z1 to have a certain height from an inner edge of the panel supporting part 241a facing the second supporting plate 241. A protrusion height of the guide projection 241b1 may be set based on a bending curvature of the bending part BP.

The rounding part 241b2 may be provided on an inner surface of the guide projection 241b1 facing the second supporting plate 241 to have a certain curvature. The rounding part 241b2 may physically contact a bottom of the flexible substrate 21 exposed by the open part 243 when the bending part BP of the flexible display panel 120 is bent, thereby bending the bending part BP at a predetermined curvature.

The second supporting plate 242 and the open part 243 are the same as the second supporting plate 142 and the open part 143 illustrated in FIG. 4, and thus, their repetitive descriptions are not provided.

In the display apparatus 200 according to the second embodiment of the present invention, the bending part BP of the flexible display panel 120 may be bent by the open part 243 provided in the back plate 240 overlapping the bending part BP of the flexible display panel 120, and thus, a defect caused by a contact between the panel driving circuit unit 130 and the cover window 110 is prevented in a bonding process of bonding the flexible display panel 120 to the cover window 110, and the bending part BP of the flexible display panel 120 is bent at a predetermined curvature according to bending guide by the bending guide part 241b.

Figure 7:
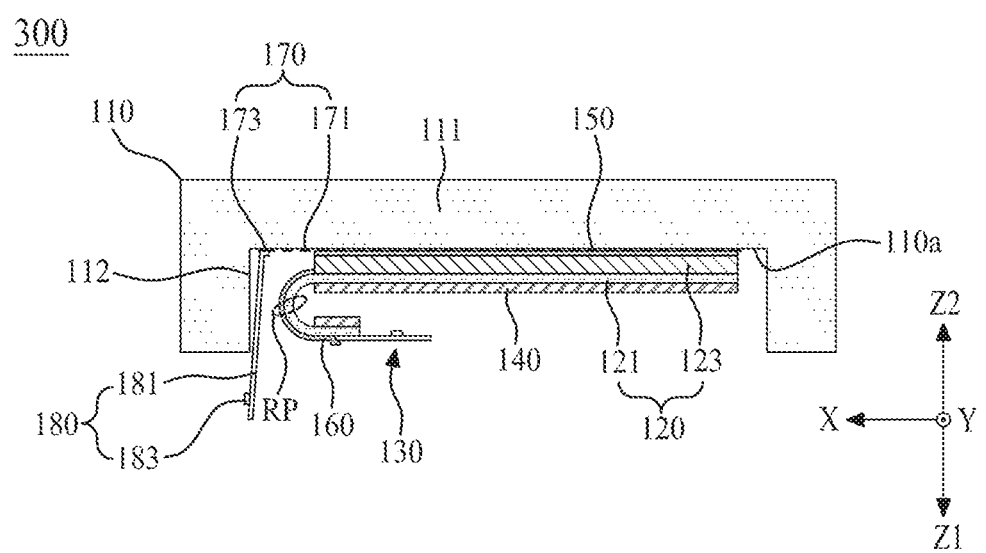
FIG. 7 is a cross-sectional view for describing a display apparatus according to a third embodiment of the present invention.

FIG. 7 is a cross-sectional view for describing a display apparatus 300 according to a third embodiment of the present invention.

Referring to FIG. 7, the display apparatus 300 according to the third embodiment of the present invention may include a cover window 110, a flexible display panel 120, a panel driving circuit unit 130, a back plate 140, a cover layer 160, a touch electrode unit 170, and a touch driving circuit unit 180. The display apparatus 300 having such a configuration may further include the touch electrode unit 170 and the touch driving circuit unit 180, in addition to the elements of the display apparatus according to the first or second embodiment of the present invention illustrated in FIGS. 3 to 6. Hereinafter, therefore, only the touch electrode unit 170, the touch driving circuit unit 180, and elements relevant thereto will be described, and descriptions of the other elements which are the same as the elements according to the preceding embodiments are not repeated.

The touch electrode unit 170 may be disposed between the cover window 110 and the flexible display panel 120 and may perform a function of a touch sensor that senses a user touch applied to the cover window 110.

The touch electrode unit 170 according to an embodiment may include a plurality of touch driving electrodes 171 which are arranged at certain intervals on a bottom 110a of the cover window 110, a plurality of touch sensing electrodes (not shown) which are electrically insulated from the plurality of touch driving electrodes 171, and a touch pad part 173 which is connected to the plurality of touch driving electrodes 171 and the plurality of touch sensing electrodes (not shown). In addition, the touch electrode unit 170 according to an embodiment may further include a dielectric layer (or an insulation layer, not shown) that generates a capacitance between a corresponding touch driving electrode and a corresponding touch sensing electrode.

The touch electrode unit 170 according to another embodiment may be implemented as a capacitive touch panel known to those skilled in the art, and may be attached to a bottom of the cover window 110 or a top of the flexible display panel 120.

The touch driving circuit unit 180 may be connected to the touch pad part 173 and may apply a touch driving pulse to the plurality of touch driving electrodes 171 to sense, through a corresponding touch sensing electrode, a change in a capacitance generated between a corresponding touch driving electrode and a corresponding touch sensing electrode, thereby generating touch sensing data corresponding to a user touch.

The touch driving circuit unit 180 according to an embodiment may include a touch flexible circuit film 181 and a touch driving IC 183.

The touch flexible circuit film 181 may be provided on the bottom 110a of the cover window 110 and may be attached to the touch pad part 173 through the film attaching process. The touch flexible circuit film 181 may be bent from the touch pad part 173 and may be disposed adjacent to the side wall 112 of the cover window 110.

The touch driving IC 181 may be mounted on the touch flexible circuit film 181 by the chip bonding process or the surface mounting process. The touch driving IC 183 may generate the touch driving pulse based on a touch enable signal supplied from the external display driving system, may apply the touch driving pulse to the plurality of touch driving electrodes 171 to sense, through a corresponding touch sensing electrode, a change in a capacitance generated between a corresponding touch driving electrode and a corresponding touch sensing electrode, and may generate touch sensing data corresponding to the sensed capacitance change to supply the generated touch sensing data to the display driving system. The display driving system may generate two-dimensionally (2D) touch information or three-dimensionally (3D) touch information, based on the touch sensing data and may execute an application program corresponding to the 2D touch information or the 3D touch information.

Optionally, the touch driving IC 183 may not be mounted on the touch flexible circuit film 181 but may be built into the display driving system. In this case, the touch flexible circuit film 181 may transfer a signal between the touch pad part 173 and the display driving system.

In the display apparatus 300 according to the third embodiment of the present invention, the bending part BP of the flexible display panel 120 may be bent by the open part 243 provided in the back plate 240 overlapping the bending part BP of the flexible display panel 120 and then may be attached to the bottom 110a of the cover window 110, and thus, a defect caused by a contact between the panel driving circuit unit 130 and the cover window 110 is prevented in a bonding process of bonding the flexible display panel 120 to the cover window 110, and defect is prevented from occurring due to a contact between the touch driving circuit unit 180 and the panel driving circuit unit 130.

Figure 8:
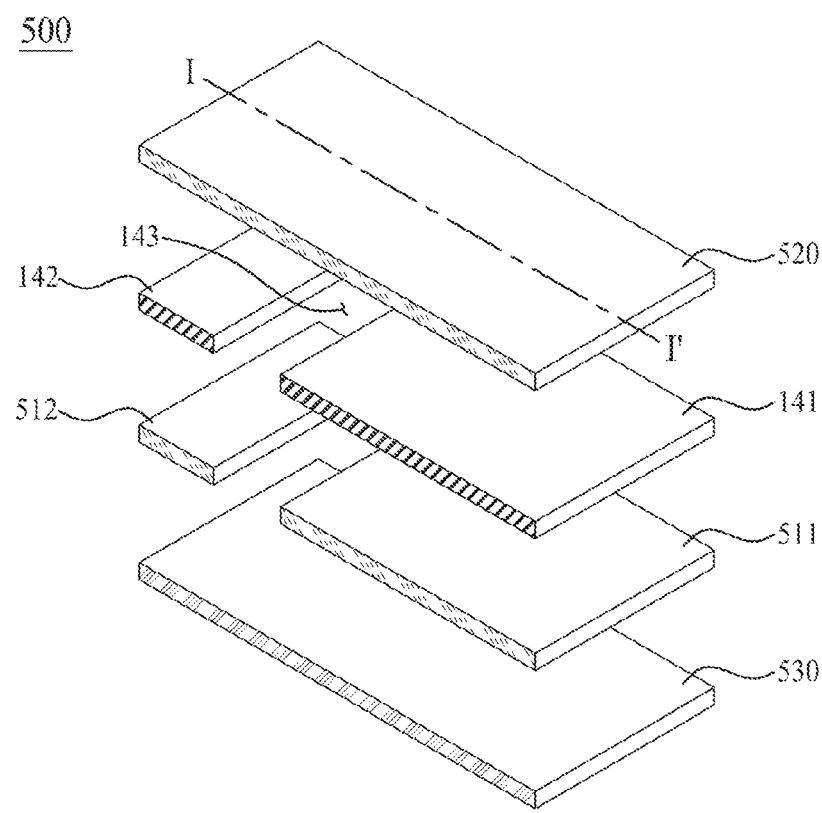
FIG. 8 is a diagram for describing a back plate member according to a first embodiment of the present invention.
Figure 9:
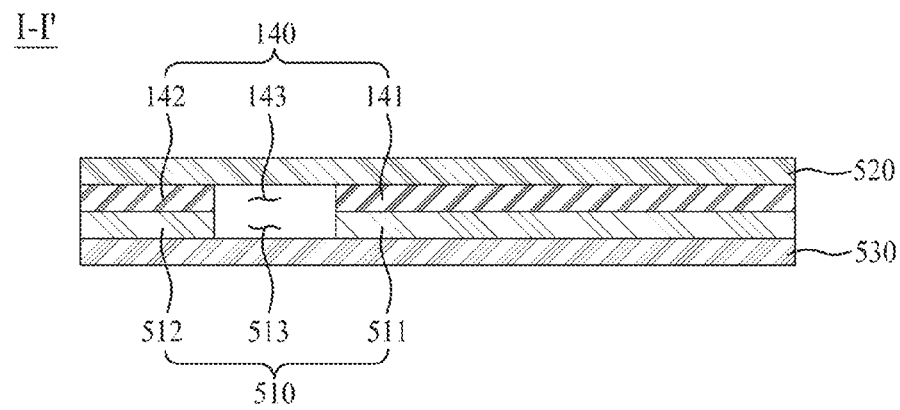
FIG. 9 is a cross-sectional view taken along line I-I' of FIG. 8.

FIG. 8 is a diagram for describing a back plate member 500 according to a first embodiment of the present invention, and FIG. 9 is a cross-sectional view taken along line I-I' of FIG. 8.

Referring to FIGS. 8 and 9, the back plate member 500 according to the first embodiment of the present invention may include a back plate 140, a first protective film 510, a second protective film 520, and a third protective film 530.

The back plate 140, as illustrated in FIGS. 3 and 4, may include first and second supporting plates 141 and 142 which are disposed in parallel with an open part 143 therebetween. A repetitive description of the back plate 140 is not provided.

The first protective film 510 may be attached to a bottom of the back plate 140 to protect the bottom of the back plate 140. The first protective film 510 according to an embodiment may include a first protection part 511 attached to a bottom of the first supporting plate 141, a second protection part 512 attached to a bottom of the second supporting plate 142, and a separation part 513 provided between the first and second protection parts 511 and 512 to overlap the open part 143 of the back plate 140.

The first protection part 511 may maintain the first supporting plate 141 in a flat state, and the second protection part 512 may maintain the second supporting plate 142 in a flat state. Also, the separation part 513 enables the first protective film 510 to be bent and enables the back plate 140 to be bent with respect to the open part 143.

The first protective film 510 may be stripped from the back plate 140 after a flexible display panel is bonded to a cover window, and thus, scratch is prevented from occurring in a bottom of the back plate 140 in a bonding process of bonding the flexible display panel to the cover window.

The second protective film 520 may be provided in a plate shape and may be attached to a top of the back plate 140. The second protective film 520 protects the top of the back plate 140 and maintains the first and second supporting plates 411 and 412, separated from each other by the open part 143, in a flat state. The second protective film 520 may be stripped from the top of the back plate 140 immediately before the back plate 140 is bonded to the flexible display panel, thereby enabling the back plate 140 to be bonded to the flexible display panel and preventing scratch from occurring in the top of the back plate 140 while the back plate member 500 is being transported.

The third protective film 530 may be provided in a flat state and may be attached to a bottom of the first protective film 510. The third protective film 530 may support the first protective film 510 to maintain, in a flat state, the first and second protection parts 511 and 512 which are separated from each other by the separation part 513, thereby maintaining the back plate 140 in a flat state. The third protective film 530 may be stripped from the first protective film 510 after the back plate 140 is bonded to a bottom of the flexible display panel, thereby supporting the first protective film 510 while the flexible display panel is being bonded to the back plate 140 and enabling pre-bending of the back plate 140 after the flexible display panel is bonded to the back plate 140.

In the back plate member 500 according to the first embodiment of the present invention, since the first and third protective films 510 and 530 are attached to the bottom of the back plate 140 including the open part 143, the back plate 140 including the open part 143 is easily bonded to the flexible display panel, and pre-bending of the back plate 140 is performed. Accordingly, a defect caused by a contact between the panel driving circuit unit and the cover window is prevented in a bonding process of bonding the flexible display panel to the cover window, and defect is prevented from occurring due to a contact between the touch driving circuit unit and the panel driving circuit unit.

The back plate member 500 according to the first embodiment of the present invention may be identically applied to the back plate 240 illustrated in FIGS. 5 and 6. In this case, except that the first protective film 510 is attached to bottoms of the first and second supporting plates 241 and 242 other than the open part 243 of the back plate 240 and a bottom of the bending guide part 241*b*, and except that a thickness of the first protective film 510 is changed to correspond to a height of the bending guide part 241*b*, the other elements are the same, and thus, their detailed descriptions are not provided.

Figure 10:
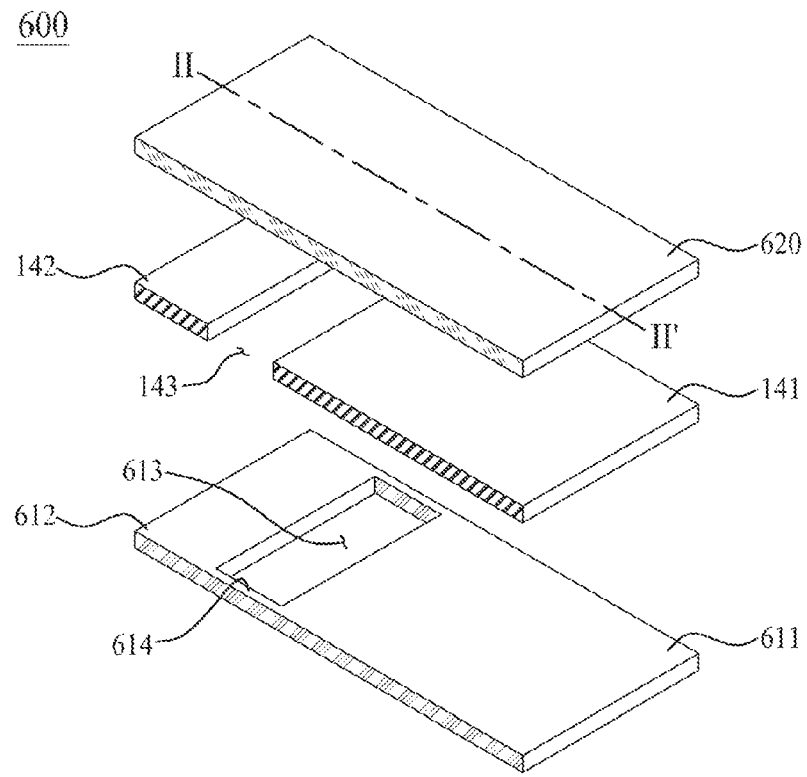
FIG. 10 is a diagram for describing a back plate member according to a second embodiment of the present invention.
Figure 11:
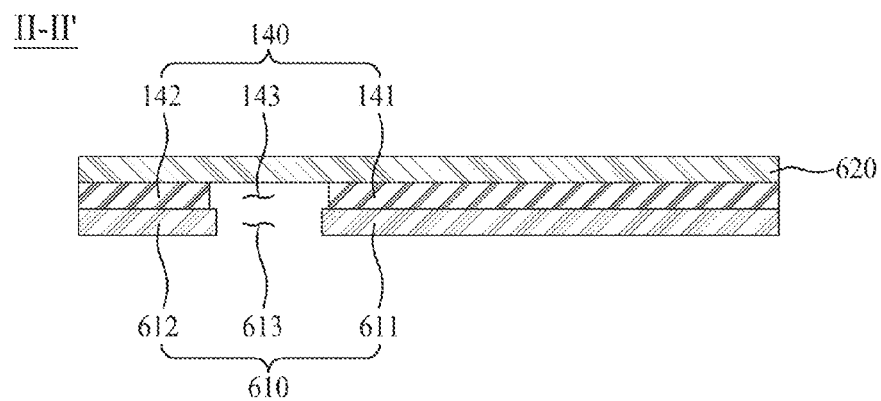
FIG. 11 is a cross-sectional view taken along line II-II' of FIG. 10.

FIG. 10 is a diagram for describing a back plate member 600 according to a second embodiment of the present invention, and FIG. 11 is a cross-sectional view taken along line II-II' of FIG. 10.

Referring to FIGS. 10 and 11, the back plate member 600 according to the second embodiment of the present invention may include a back plate 140, a first protective film 610, and a second protective film 620.

The back plate 140, as illustrated in FIGS. 3 and 4, may include first and second supporting plates 141 and 142 which are disposed in parallel with an open part 143 therebetween. A repetitive description of the back plate 140 is not provided.

The first protective film 610 may be attached to a bottom of the back plate 140 to protect the bottom of the back plate 140. The first protective film 610 according to an embodiment may include a first protection part 611 attached to a bottom of the first supporting plate 141, a second protection part 612 attached to a bottom of the second supporting plate 142, a separation part 613 overlapping the open part 143 of the back plate 140, and a bridge 614 coupling the first protection part 611 to the second protection part 612.

The first protection part 611 may maintain the first supporting plate 141 in a flat state, and the second protection part 612 may maintain the second supporting plate 142 in a flat state.

A portion of a bending area of the first protective film 610 provided between the first and second protection parts 611 and 612 may be removed in a tetragonal shape, and thus, the separation part 613 may be provided. The separation part 613 enables the first protective film 610 to be bent and enables the back plate 140 to be bent with respect to the open part 143.

The bridge 614 may couple the first protection part 611 to the second protection part 612, thereby preventing the first protection part 611 from being separated from the second protection part 612 by the separation part 613. In this case, the bridge 614 enables the back plate 140 to be bent with respect to the open part 143 only when a bending force is equal to or greater than a threshold value, and when the bending force is less than the threshold value, the bridge 614 causes each of the first and second protection parts 611 and 612 to be maintained in a flat state.

In addition, in FIG. 10, a film open part 143 is illustrated as having one tetragonal shape, but is not limited thereto. In other embodiments, the first protective film 610 may include a plurality of the separation parts 613 which are arranged at certain intervals, and the bridge 614 may be provided between the plurality of separation parts 613.

Since the first protective film 610 includes the separation part 613, pre-bending of the back plate 140 may be performed after a flexible display panel is bonded to the back plate 140. Also, the first protective film 610 may be stripped from the back plate 140 after the flexible display panel is bonded to a cover window, and thus, scratch is prevented from occurring in a bottom of the back plate 140 in a bonding process of bonding the flexible display panel to the cover window.

The second protective film 620 may be provided in a plate shape and may be attached to a top of the back plate 140. The second protective film 620 protects the top of the back plate 140 and maintains the first and second supporting plates 411 and 412, separated from each other by the open part 143, in a flat state. The second protective film 620 may be stripped from the top of the back plate 140 immediately before the back plate 140 is bonded to the flexible display panel, thereby enabling the back plate 140 to be bonded to the flexible display panel and preventing scratch from occurring in the top of the back plate 140 while the back plate member 600 is being transported.

Figure 12:
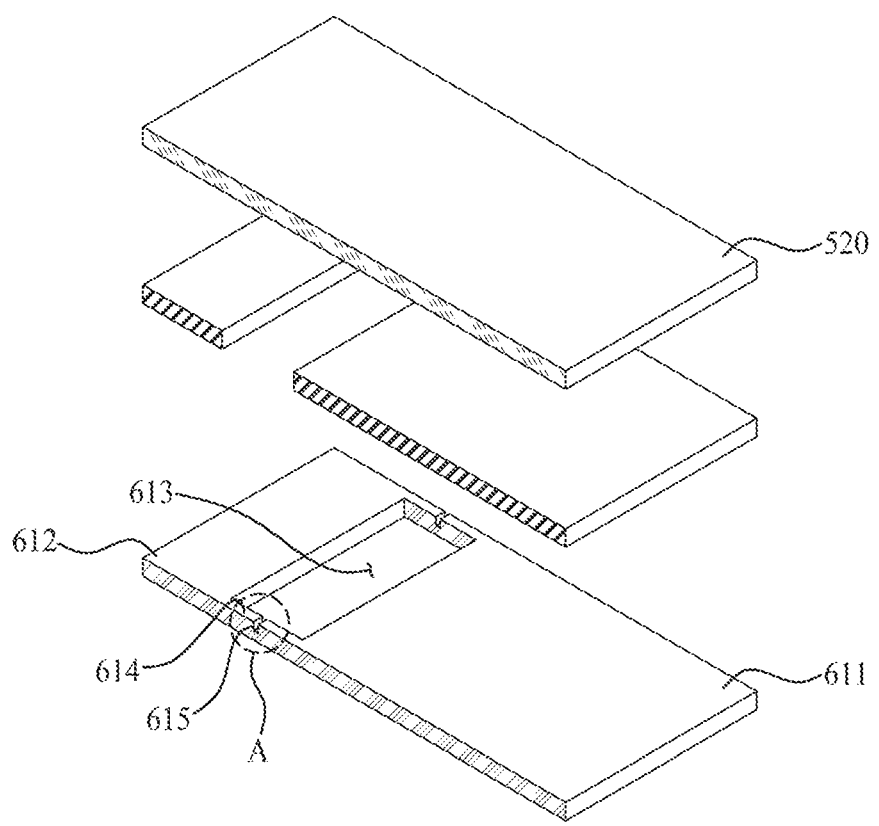
FIG. 12 is a diagram for describing a cutting groove provided in a bridge illustrated in FIG. 10.

In addition, as illustrated in a portion A of FIG. 12, the back plate member 600 according to the second embodiment of the present invention may further include at least one cutting groove 615 provided in the bridge 614.

The cutting groove 615 may guide bending of the first protective film 610 with respect to the bridge 614 and thus enables a bending area of each of the first protective film 610 and the back plate 140 to be easily bent by a bending force which is equal to or greater than the threshold value.

In the back plate member 600 according to the second embodiment of the present invention, since the first protective film 610 including the separation part 613 is attached to the bottom of the back plate 140 including the open part 143, the back plate 140 including the open part 143 is easily bonded to the flexible display panel, and pre-bending of the back plate 140 is performed. Accordingly, a defect caused by a contact between the panel driving circuit unit and the cover window is prevented in a bonding process of bonding the flexible display panel to the cover window, and defect is prevented from occurring due to a contact between the touch driving circuit unit and the panel driving circuit unit.

FIGS. 13A to 13G are diagrams for describing a method of manufacturing a display apparatus according to one embodiment of the present invention.

The method of manufacturing a display apparatus according to one embodiment of the present invention will be described below with reference to FIGS. 13A to 13G.

Figure 13A:
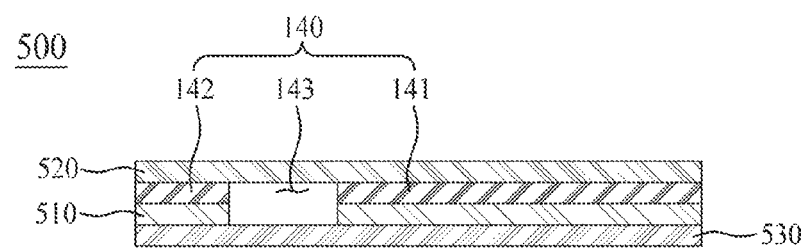
FIGS. 13A to 13G are diagrams for describing a method of manufacturing a display apparatus according to one embodiment of the present invention.

First, as illustrated in FIG. 13A, a back plate member 500 may be prepared. The back plate member 500 is the same as the back plate member according to the first embodiment of the present invention illustrated in FIGS. 8 and 9, and thus, its repetitive description is not provided.

Moreover, as illustrated in FIG. 4, the flexible display panel 120 to which the panel driving circuit unit 130 is attached may be prepared. Here, the flexible display panel 120 may include the pixel array part 123, the pad part 125 connected to the pixel array part 123, and the bending part BP between the pixel array part 123 and the pad part 125. A description of the flexible display panel 120 is not repeated. Also, as illustrated in FIG. 5, the cover window 110 which includes the front part 111 and the side wall 112 provided on each of both sides of the front part 111 may be prepared.

Figure 13B:
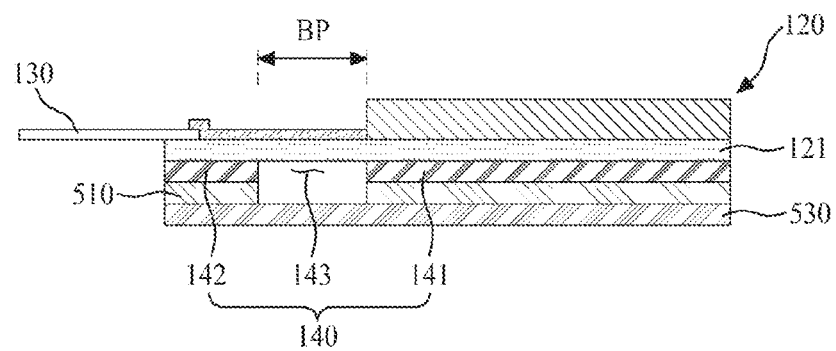

Subsequently, a second protective film 520 may be stripped from a top of a back plate 140 in the back plate member 500, and as illustrated in FIG. 13B, the back plate member 500 may be attached to, through a lamination process, a bottom of a flexible display panel 120 to which a panel driving circuit 130 is attached. Therefore, the top of the back plate 140 provided in the back plate member 500 may be attached to the bottom of the flexible display panel 120, and thus, the flexible display panel 120 and the back plate 140 may be maintained in a flat state by a third protective film 530 of the back plate member 500 having a plate shape, and the bottom of the back plate 140 is protected by the first and third protective films 510 and 530. In this case, an open part 143 of the back plate 140 may overlap the bending part BP of the flexible display panel 120.

Figure 13C:
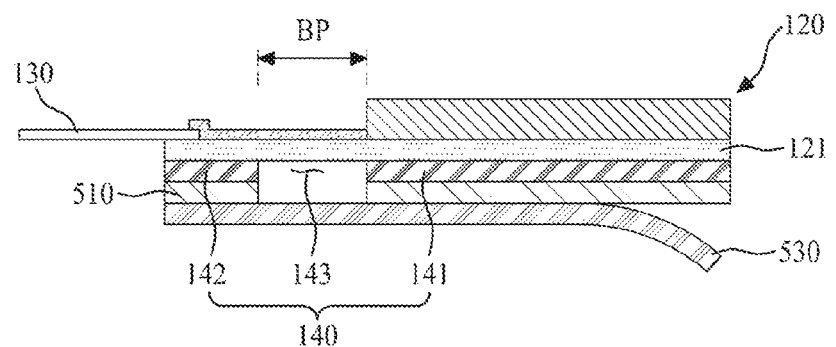
Figure 13D:
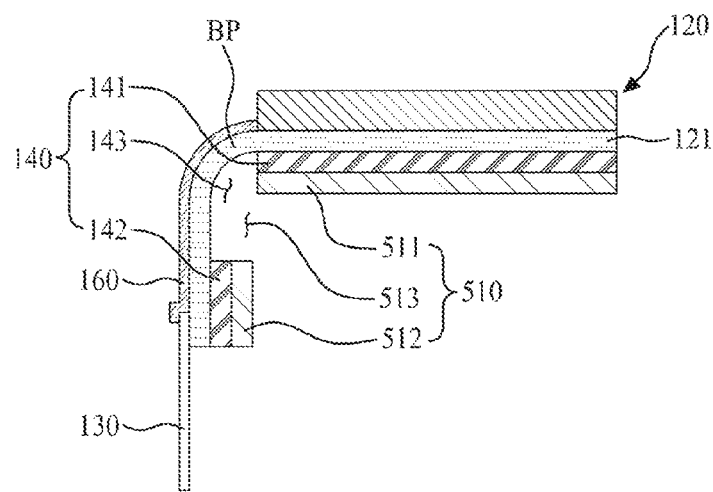

Subsequently, as illustrated in FIGS. 13C and 13D, the third protective film 530 of the back plate member 500 may be stripped from the first protective film 510 for pre-bending the bending part BP of the flexible display panel 120 (i.e., a flexible substrate 121), and then, the bending part BP of the flexible display panel 120 may be pre-bent. That is, a restraining force of the third protective film 530 applied to a second supporting plate 142 of the back plate 140 may be released by stripping the third protective film 530 of the back plate member 500, and then, the bending part BP of the flexible display panel 120 which is exposed by the open part 143 of the back plate 140 and a separation part 513 of the first protective film 510 and is in a bendable state may be pre-bent. In this case, a bottom of the back plate 140 is protected by the first protective film 510. Also, a link line provided in the pre-bent bending part BP of the flexible display panel 120 may be disposed on a neutral plane of the bending part BP by a cover layer 160, and thus may be pre-bent without being damaged by a bending stress.

Figure 13E:
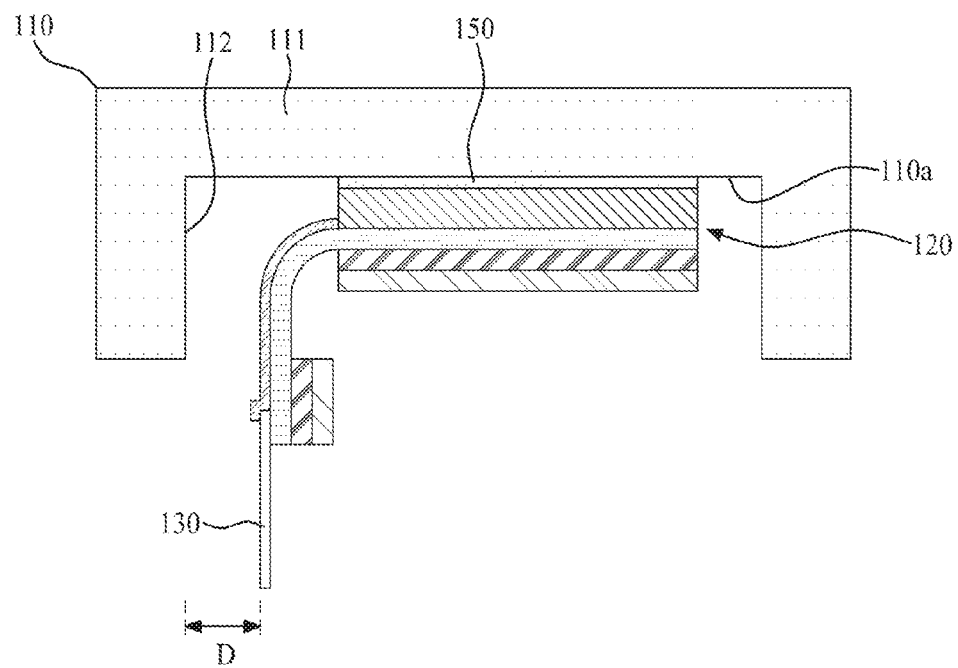

Subsequently, as illustrated in FIG. 13E, the pre-bent flexible display panel 120 may be bonded to a bottom 110a of the front part 111 of the cover window 110 through a direct bonding process using a transparent adhesive member 150. In this case, a panel driving circuit unit 130 attached to the pre-bent flexible display panel 120 may be spaced apart from a side wall 112 of the cover window 110 by a certain distance D, and thus, a defect caused by a contact between the panel driving circuit unit 130 and the cover window 110 does not occur in the direct bonding process, thereby enhancing an efficiency of the direct bonding process. In the direct bonding process, the bottom of the back plate 140 is protected by the first protective film 510, and thus, scratch does not occur in the bottom of the back plate 140.

Figure 13F:
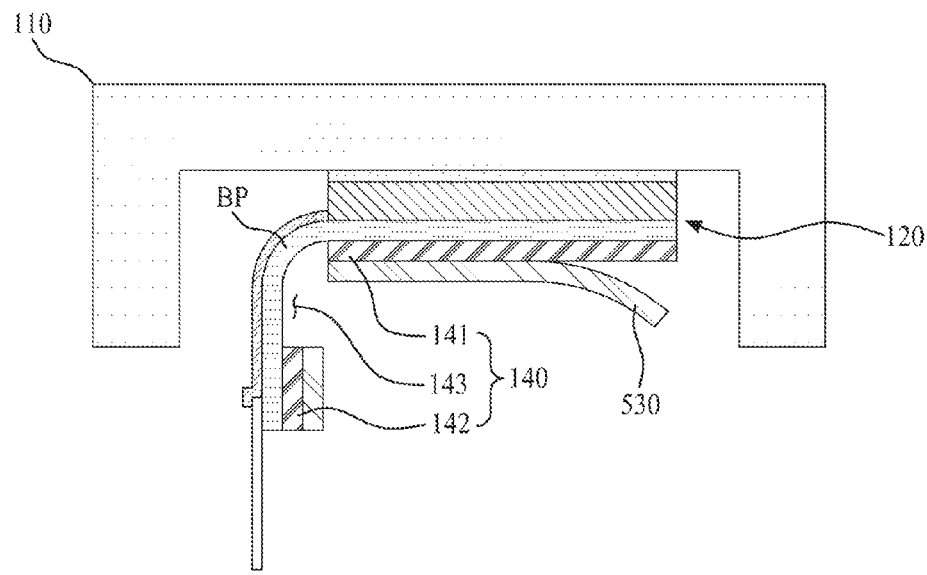

Subsequently, as illustrated in FIG. 13F, the first protective film 510 of the back plate member 500 may be stripped from the back plate 140 for bending the bending part BP of the flexible display panel 120 (i.e., the flexible substrate 121) at a certain curvature.

Figure 13G:
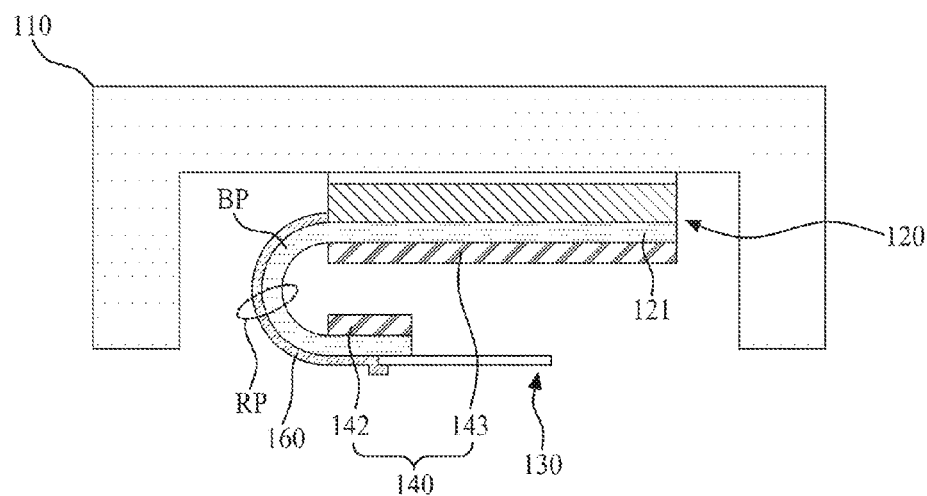

Subsequently, as illustrated in FIG. 13G, by bending the bending part BP of the flexible display panel 120 (i.e., the flexible substrate 121) at a certain curvature RP, the panel driving circuit unit 130 may be disposed under a first supporting plate 141 of the back plate 140 through additional bending of the bending part BP. Here, the second supporting plate 142 of the back plate 140 may be attached and fixed to a bottom of the first supporting plate 141 by an adhesive member such as a double-sided tape. Also, the link line provided in the bending part BP of the flexible display panel 120 may be disposed on the neutral plane of the bending part BP by the cover layer 160, and thus may be bent at a certain curvature without being damaged by a bending stress caused by the bending.

In addition, as illustrated in FIG. 7, the touch electrode unit 170 may be provided on the bottom 110a of the cover window 110, and the touch driving circuit unit 180 may be attached to the touch pad part 173 of the touch electrode unit 170. In this case, with the touch driving circuit unit 180 being supported by a separate zig, the flexible display panel which has been pre-bent through the direct bonding process illustrated in FIG. 13E may be bonded to the bottom 110a of the front part 111 of the cover window 110. Therefore, the panel driving circuit unit 130 attached to the pre-bent flexible display panel 120 may be spaced apart from, by the certain distance D, the touch driving circuit unit 180 as well as the side wall 112 of the cover window 110, and thus, a defect caused by a contact between the panel driving circuit unit 130 and the cover window 110 and a defect caused by a contact between the panel driving circuit unit 130 and the touch driving circuit unit 180 do not occur in the direct bonding process, thereby improving an efficiency of the direct bonding process.

In the method of manufacturing a display apparatus according to one embodiment of the present invention, the flexible display panel 120 may be pre-bent by using the back plate member 500 including the first protective film 510 attached to the bottom of the back plate 140 including the open part 143, and then, the pre-bent flexible display panel 120 may be direct-bonded to the bottom of the cover window 110. Accordingly, in the direct bonding process, a defect caused by a contact between the panel driving circuit unit 130 and the cover window 110 is prevented, and a defect caused by a contact between the panel driving circuit unit 130 and the touch driving circuit unit 180 is prevented.

FIGS. 14A to 14F are diagrams for describing a method of manufacturing a display apparatus according to another embodiment of the present invention.

The method of manufacturing a display apparatus according to the other embodiment of the present invention will be described below with reference to FIGS. 14A to 14F.

Figure 14A:
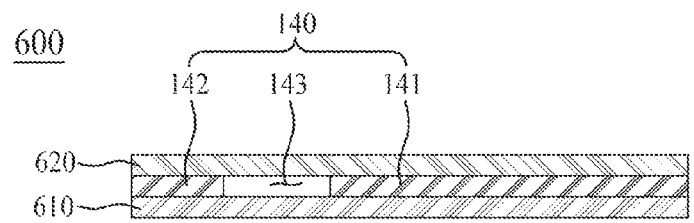
FIGS. 14A to 14F are diagrams for describing a method of manufacturing a display apparatus according to another embodiment of the present invention.

First, as illustrated in FIG. 14A, a back plate member 600 may be prepared. The back plate member 600 is the same as the back plate member according to the embodiment of the present invention illustrated in FIGS. 10 and 11, and thus, its repetitive description is not provided.

Moreover, as illustrated in FIG. 4, the flexible display panel 120 to which the panel driving circuit unit 130 is attached may be prepared. Here, the flexible display panel 120 may include the pixel array part 123, the pad part 125 connected to the pixel array part 123, and the bending part BP between the pixel array part 123 and the pad part 125. A description of the flexible display panel 120 is not repeated. Also, as illustrated in FIG. 3, the cover window 110 which includes the front part 111 and the side wall 112 provided on each of both sides of the front part 111 may be prepared.

Figure 14B:
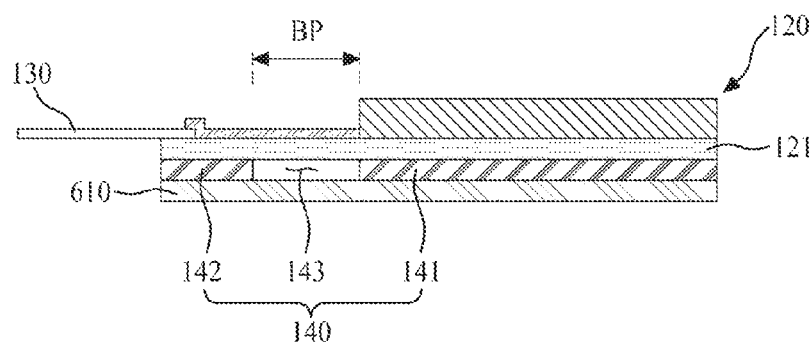

Subsequently, a second protective film 620 may be stripped from a top of a back plate 140 in the back plate member 600, and as illustrated in FIG. 14B, the back plate member 600 may be attached to, through a lamination process, a bottom of a flexible display panel 120 to which a panel driving circuit 130 is attached. Therefore, the top of the back plate 140 provided in the back plate member 600 may be attached to the bottom of the flexible display panel 120, and thus, the flexible display panel 120 and the back plate 140 may be maintained in a flat state by a first protective film 610 of the back plate member 600, and the bottom of the back plate 140 is protected by the first protective film 610. In this case, an open part 143 of the back plate 140 may overlap the bending part BP of the flexible display panel 120.

Figure 14C:
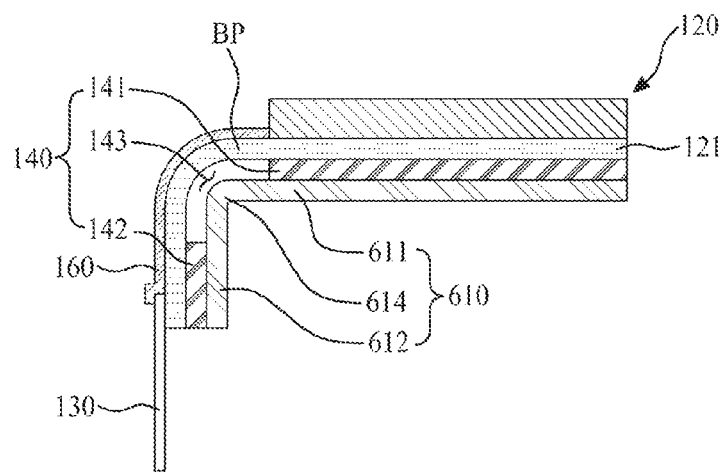

Subsequently, as illustrated in FIG. 14C, the bending part BP of the flexible display panel 120 (i.e., a flexible substrate 121) may be pre-bent. In this case, a bridge 614 of the first protective film 610 may be bent at a certain curvature according to the pre-bending of the flexible display panel 120, and thus enables the flexible substrate 121 to be pre-bent. That is, the first protective film 610 may include a film open part 143 (see FIG. 10) overlapping the open part 143 of the back plate 140, and thus may be bent at a certain curvature according to the pre-bending of the flexible display panel 120. In this case, a bottom of the back plate 140 is protected by first and second protection parts 611 and 612 of the first protective film 610. Also, a link line provided in the pre-bent bending part BP of the flexible display panel 120 may be disposed on a neutral plane of the bending part BP by a cover layer 160, and thus may be pre-bent without being damaged by a bending stress.

Figure 14D:
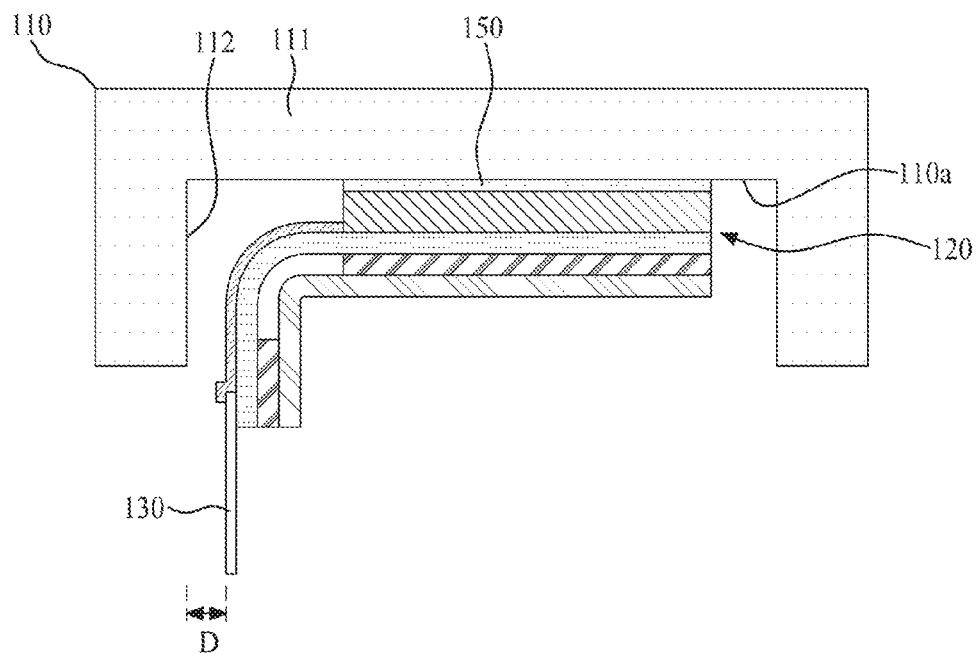

Subsequently, as illustrated in FIG. 14D, the pre-bent flexible display panel 120 may be bonded to a bottom 110a of the front part 111 of the cover window 110 through a direct bonding process using a transparent adhesive member 150. In this case, a panel driving circuit unit 130 attached to the pre-bent flexible display panel 120 may be spaced apart from a side wall 112 of the cover window 110 by a certain distance D, and thus, a defect caused by a contact between the panel driving circuit unit 130 and the cover window 110 does not occur in the direct bonding process, thereby enhancing an efficiency of the direct bonding process. In the direct bonding process, the bottom of the back plate 140 is protected by the first protective film 510, and thus, scratch does not occur in the bottom of the back plate 140.

Figure 14E:
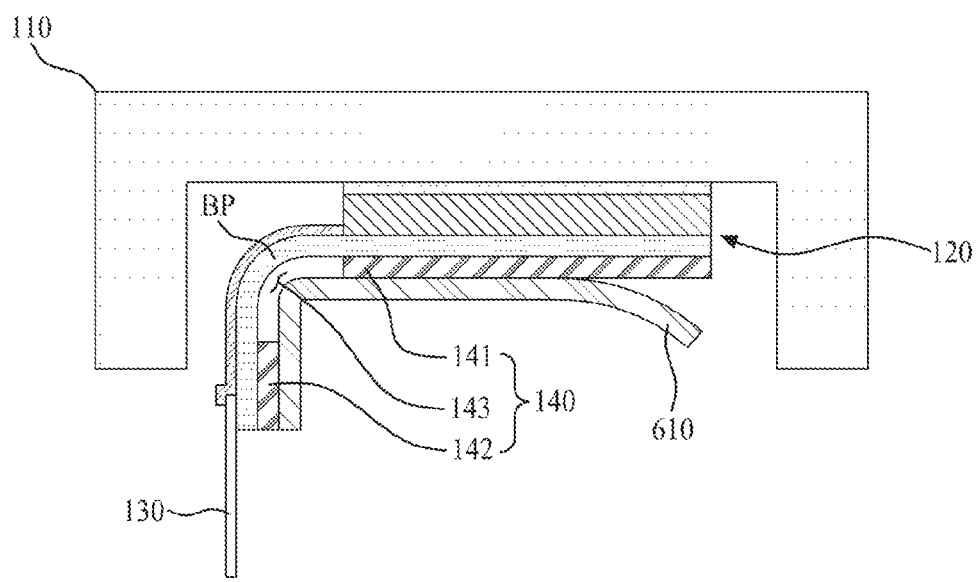

Subsequently, as illustrated in FIG. 14E, the first protective film 610 of the back plate member 600 may be stripped from the back plate 140 for bending the bending part BP of the flexible display panel 120 (i.e., the flexible substrate 121) at a certain curvature.

Figure 14F:
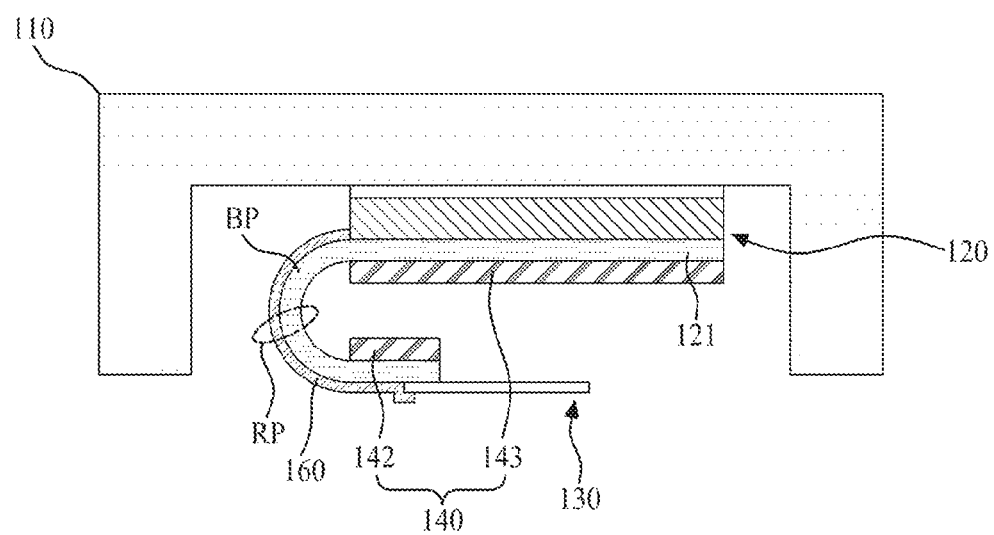

Subsequently, as illustrated in FIG. 14F, by bending the bending part BP of the flexible display panel 120 (i.e., the flexible substrate 121) at a certain curvature RP, the panel driving circuit unit 130 may be disposed under a first supporting plate 141 of the back plate 140 through additional bending of the bending part BP. Here, the second supporting plate 142 of the back plate 140 may be attached and fixed to a bottom of the first supporting plate 141 by an adhesive member such as a double-sided tape.

In addition, as illustrated in FIG. 7, the touch electrode unit 170 may be provided on the bottom 110a of the cover window 110, and the touch driving circuit unit 180 may be attached to the touch pad part 173 of the touch electrode unit 170. In this case, with the touch driving circuit unit 180 being supported by a separate zig, the flexible display panel 120 which has been pre-bent through the direct bonding process illustrated in FIG. 14D may be bonded to the bottom 110a of the front part 111 of the cover window 110. Therefore, the panel driving circuit unit 130 attached to the pre-bent flexible display panel 120 may be spaced apart from, by the certain distance D, the touch driving circuit unit 180 as well as the side wall 112 of the cover window 110, and thus, a defect caused by a contact between the panel driving circuit unit 130 and the cover window 110 and a defect caused by a contact between the panel driving circuit unit 130 and the touch driving circuit unit 180 do not occur in the direct bonding process, thereby improving an efficiency of the direct bonding process.

In the method of manufacturing a display apparatus according to the first embodiment of the present invention, the flexible display panel 120 may be pre-bent by using the back plate member 600 including the first protective film 610 attached to the bottom of the back plate 140 including the open part 143, and then, the pre-bent flexible display panel 120 may be direct-bonded to the bottom of the cover window 110. Accordingly, in the direct bonding process, a defect caused by a contact between the panel driving circuit unit 130 and the cover window 110 is prevented, and a defect caused by a contact between the panel driving circuit unit 130 and the touch driving circuit unit 180 is prevented.

FIGS. 15A to 15F are diagrams for describing a method of manufacturing a display apparatus according to yet another embodiment of the present invention.

The method of manufacturing a display apparatus according to the yet another embodiment of the present invention will be described below with reference to FIGS. 15A to 15F.

Figure 15A:
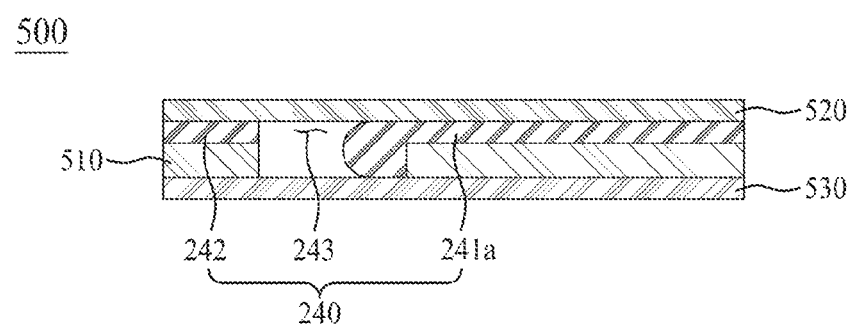
FIGS. 15A to 15F are diagrams for describing a method of manufacturing a display apparatus according to yet another embodiment of the present invention.

First, as illustrated in FIG. 15A, a back plate member 500 may be prepared. The back plate member 500 may include a back plate 240 and first to third protective films 510, 520 and 530. The back plate 240 is the same as the back plate of the display apparatus according to the embodiment of the present invention illustrated in FIGS. 5 and 6, and except that a thickness of the first protective film 510 is changed depending on a structure of the back plate 240 in the back plate member according to the first embodiment of the present invention illustrated in FIGS. 8 and 9, the first to third protective films 510, 520 and 530 illustrated in FIG. 15A are the same as the first to third protective films 510, 520 and 530 of the back plate member according to the first embodiment of the present invention illustrated in FIGS. 8 and 9. Thus, repetitive descriptions of the elements are not provided.

Moreover, as illustrated in FIG. 6, the flexible display panel 120 to which the panel driving circuit unit 130 is attached may be prepared. Here, the flexible display panel 120 may include the pixel array part 123, the pad part 125 connected to the pixel array part 123, and the bending part BP between the pixel array part 123 and the pad part 125. A description of the flexible display panel 120 is not repeated. Also, as illustrated in FIG. 5, the cover window 110 which includes the front part 111 and the side wall 112 provided on each of both sides of the front part 111 may be prepared.

Figure 15B:
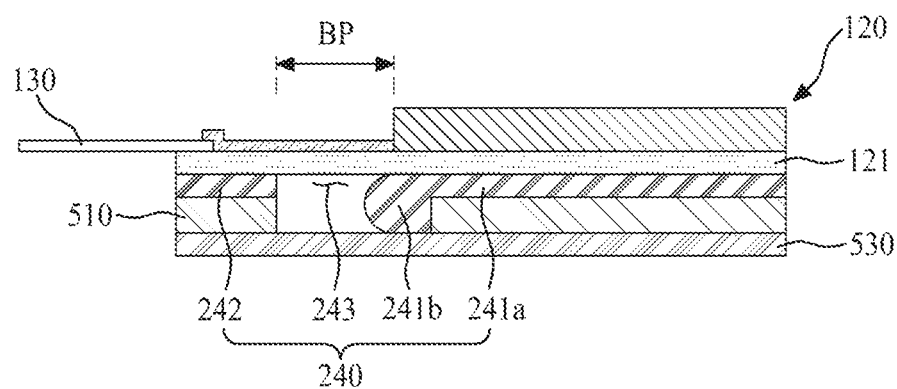

Subsequently, a second protective film 520 may be stripped from a top of the back plate 240 in the back plate member 500, and as illustrated in FIG. 15B, the back plate member 500 may be attached to, through a lamination process, a bottom of a flexible display panel 120 to which a panel driving circuit 130 is attached. Therefore, the top of the back plate 240 provided in the back plate member 500 may be attached to the bottom of the flexible display panel 120, and thus, the flexible display panel 120 and the back plate 240 may be maintained in a flat state by a third protective film 530 of the back plate member 500 having a plate shape, and the bottom of the back plate 240 is protected by the first and third protective films 510 and 530. In this case, an open part 243 of the back plate 240 may overlap the bending part BP of the flexible display panel 120.

Figure 15C:
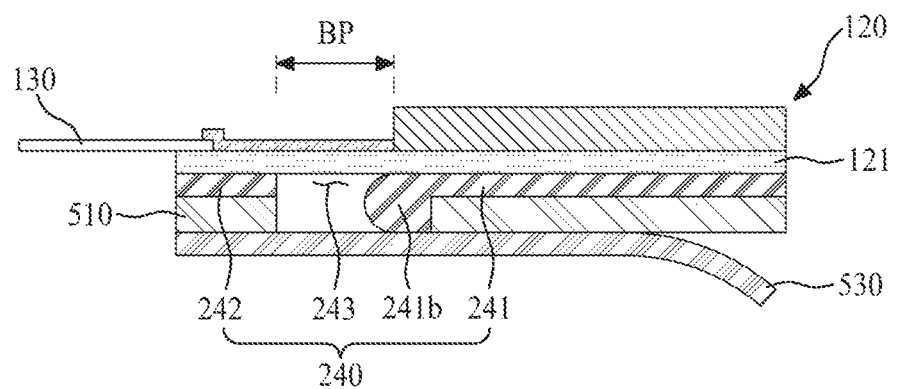
Figure 15D:
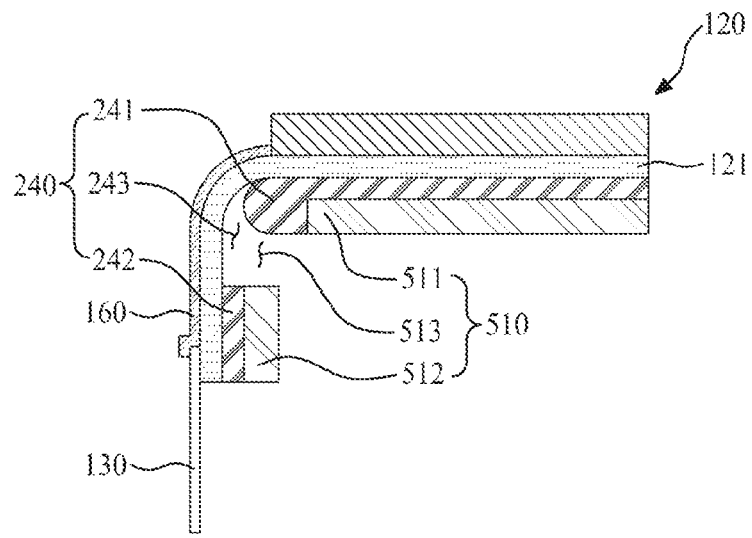

Subsequently, as illustrated in FIGS. 15C and 15D, the third protective film 530 of the back plate member 500 may be stripped from the first protective film 510 for pre-bending the bending part BP of the flexible display panel 120 (i.e., a flexible substrate 121), and then, the bending part BP of the flexible display panel 120 may be pre-bent. That is, a restraining force of the third protective film 530 applied to a second supporting plate 242 of the back plate 240 may be released by stripping the third protective film 530 of the back plate member 500, and then, the bending part BP of the flexible display panel 120 which is exposed by the open part 243 of the back plate 240 and a separation part 513 of the first protective film 510 and is in a bendable state may be pre-bent. In this case, a bottom of the back plate 240 is protected by the first protective film 510. Also, a link line provided in the pre-bent bending part BP of the flexible display panel 120 may be disposed on a neutral plane of the bending part BP by a cover layer 160, and thus may be pre-bent without being damaged by a bending stress.

Figure 15E:
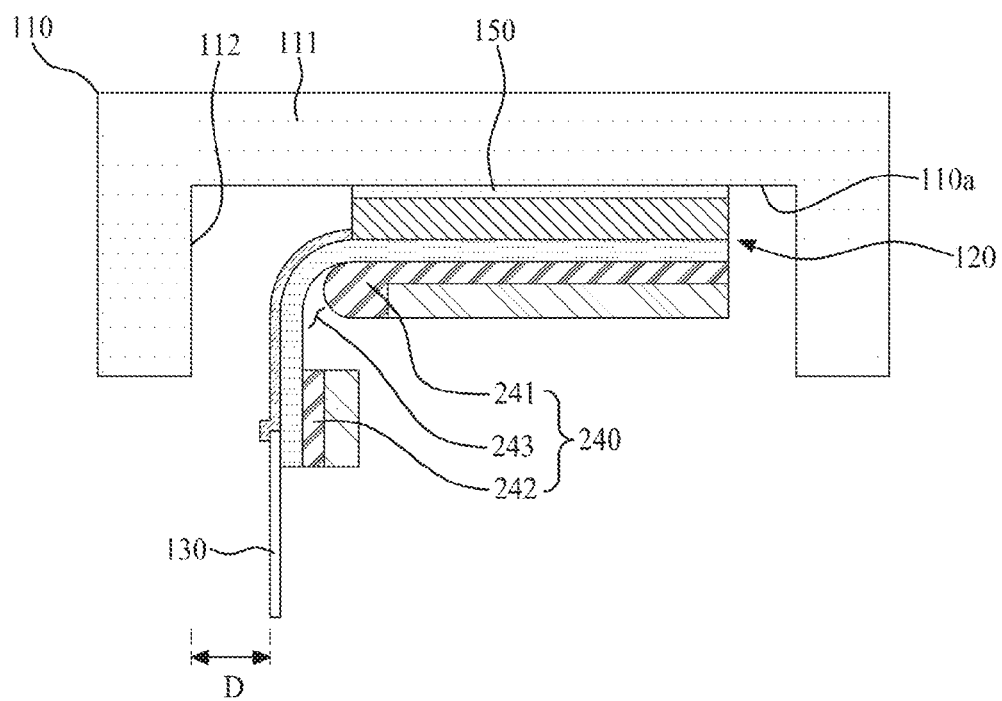

Subsequently, as illustrated in FIG. 15E, the pre-bent flexible display panel 120 may be bonded to a bottom 110a of the front part 111 of the cover window 110 through a direct bonding process using a transparent adhesive member 150. In this case, a panel driving circuit unit 130 attached to the pre-bent flexible display panel 120 may be spaced apart from a side wall 112 of the cover window 110 by a certain distance D, and thus, a defect caused by a contact between the panel driving circuit unit 130 and the cover window 110 does not occur in the direct bonding process, thereby enhancing an efficiency of the direct bonding process. In the direct bonding process, the bottom of the back plate 240 is protected by the first protective film 510, and thus, scratch does not occur in the bottom of the back plate 240.

Subsequently, the first protective film 510 of the back plate member 500 may be stripped from the back plate 240 for bending the bending part BP of the flexible display panel 120 (i.e., the flexible substrate 121) at a certain curvature.

Figure 15F:
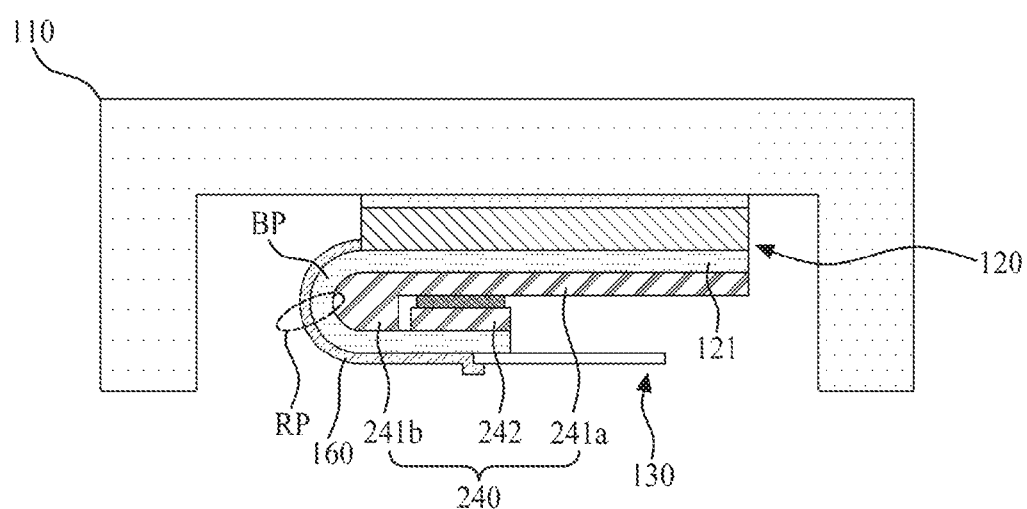

Subsequently, as illustrated in FIG. 15F, by bending the bending part BP of the flexible display panel 120 (i.e., the flexible substrate 121) at a certain curvature RP, the panel driving circuit unit 130 may be disposed under a first supporting plate 241 of the back plate 240 through additional bending of the bending part BP. In this case, the bending part BP of the flexible substrate 121 may be bent to have a curvature corresponding to a curvature of a bending guide part 241b provided in the first supporting plate 241. Also, the second supporting plate 242 of the back plate 240 may be attached and fixed to a bottom of a panel supporting part 241a of the first supporting plate 241 by an adhesive member such as a double-sided tape. Also, the link line provided in the bending part BP of the flexible display panel 120 may be disposed on the neutral plane of the bending part BP by the cover layer 160, and thus may be bent at a certain curvature without being damaged by a bending stress caused by the bending.

In addition, as illustrated in FIG. 7, the touch electrode unit 170 may be provided on the bottom 110a of the cover window 110, and the touch driving circuit unit 180 may be attached to the touch pad part 173 of the touch electrode unit 170. In this case, with the touch driving circuit unit 180 being supported by a separate zig, the flexible display panel 120 which has been pre-bent through the direct bonding process illustrated in FIG. 15E may be bonded to the bottom 110a of the front part 111 of the cover window 110. Therefore, the panel driving circuit unit 130 attached to the pre-bent flexible display panel 120 may be spaced apart from, by the certain distance D, the touch driving circuit unit 180 as well as the side wall 112 of the cover window 110, and thus, a defect caused by a contact between the panel driving circuit unit 130 and the cover window 110 and a defect caused by a contact between the panel driving circuit unit 130 and the touch driving circuit unit 180 do not occur in the direct bonding process, thereby improving an efficiency of the direct bonding process.

In the method of manufacturing a display apparatus according to the yet another embodiment of the present invention, the flexible display panel 120 may be pre-bent by using the back plate member 500 including the first protective film 510 attached to the bottom of the back plate 240 including the open part 243, and then, the pre-bent flexible display panel 120 may be direct-bonded to the bottom of the cover window 110. Accordingly, in the direct bonding process, a defect caused by a contact between the panel driving circuit unit 130 and the cover window 110 is prevented, and a defect caused by a contact between the panel driving circuit unit 130 and the touch driving circuit unit 180 is prevented.

Moreover, in the method of manufacturing a display apparatus according to the embodiment of FIGS. 5 and 6, the bending part BP of the flexible display panel 120 may be bent at a curvature corresponding to a curvature of the bending guide part 241*b* provided in the back plate 240.

The display apparatus according to the embodiments of the present invention may be applied to portable electronic devices such as mobile communication terminals, electronic organizers, portable multimedia players (PMPs), navigations, ultra-mobile personal computers (UMPCs), mobile phones, smartphones, tablet personal computers (PCs), watch phones, and wearable devices, etc.

As described above, according to the embodiments of the present invention, by using the pre-bending of the flexible display panel, a defect caused by a contact between the panel driving circuit unit and the cover window is prevented in the bonding process of bonding the flexible display panel to the cover window.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A back plate member for a flexible apparatus, the back plate member comprising:
    a back plate including a first supporting plate and a second supporting plate parallel to the first supporting plate, the second supporting plate separated from the first supporting plate by an open part;
    a first protective film including a first protection part attached to a bottom of the first supporting plate, a second protection part attached to a bottom of the second supporting plate, and a separation part overlapping the open part; and
    a second protective film attached to a top of the back plate, the second protective film having a plate shape,
    wherein the first protective film further comprises a bridge comprising a first bridge part and a second bridge part separated by the separation part, the first bridge part and the second bridge part connecting the first protection part and the second protection part to each other, the first protection part and the second protection part separated from each other by the separation part,
    wherein the first protection part, the second protection part, the first bridge part and the second bridge part surround the separation part.

2. The back plate member of claim 1, wherein the first protective film is formed with a cutting groove in each of the first bridge part and the second bridge part the cutting groove traversing across a longitudinal direction of the bridge.

3. The back plate member of claim 1, further comprising a third protective film attached to a bottom of the first protective film, the third protective film having a plate shape.

4. The back plate member of claim 1, wherein the first supporting plate comprises:
    a panel supporting part having a plate shape; and
    a bending guide part provided in an inner edge of the panel supporting part and facing the second supporting plate.

5. The back plate member of claim 4, wherein the bending guide part comprises:
    a guide projection protruding from the inner edge of the panel supporting part; and
    a rounding part provided on an inner surface of the guide projection and facing the second supporting plate.

6. A display apparatus comprising:
    a cover window including a front part and a side wall provided on each of both sides of the front part;
    a flexible display panel including a pixel array part bonded to a bottom of the front part of the cover window, a pad part connected to the pixel array part, and a bending part between the pixel array part and the pad part;
    a panel driving circuit unit connected to the pad part;
    a back plate including a first supporting plate supporting the pixel array part, a second supporting plate supporting the pad part, and an open part overlapping the bending part;
    a protective film including a first protection part attached to a bottom of the back plate, the protective film comprising a first protection part attached to a bottom of the first supporting plate, a second protection part attached to a bottom of the second supporting plate, a separation part overlapping the open part, and a bridge comprising a first bridge part and a second bridge part separated by the separation part, the first bridge part and the second bridge part connecting the first protection part and the second protection part to each other the first protection part and the second protection part separated from each other by the separation part, wherein the first protection part, the second protection part, the first bridge part and the second bridge part surround the separation part; and
    a cover layer provided on the bending part to cover a link line between the pixel array part and the pad part,
    wherein:
    the bending part of the flexible display panel is bent in a curved shape and is surrounded by the side wall of the cover window,
    a bottom of the second supporting plate is disposed to face a bottom of the first supporting plate, and
    the cover layer causes the link line to be disposed on a neutral plane when the bending part of the flexible display panel is bent at a certain curvature.

7. The display apparatus of claim 6, further comprising:
    a touch electrode unit disposed between the cover window and the flexible display panel; and
    a touch driving circuit unit connected to the touch electrode unit.

8. The display apparatus of claim 6, wherein the first supporting plate comprises:
    a panel supporting part supporting the pixel array part, the panel supporting part having a plate shape; and
    a bending guide part provided in an inner edge of the panel supporting part and facing the second supporting plate.

9. The display apparatus of claim 8, wherein the bending guide part comprises:
    a guide projection protruding from the inner edge of the panel supporting part; and
    a rounding part provided on an inner surface of the guide projection and facing the second supporting plate.

10. The display apparatus of claim 8, further comprising:
    a touch electrode unit disposed between the cover window and the flexible display panel; and a touch driving circuit unit connected to the touch electrode unit.

11. A method of manufacturing a display apparatus, the method comprising:
providing a flexible display panel which includes a pixel array part, a pad part connected to the pixel array part, and a bending part between the pixel array part and the pad part;
providing a back plate member which includes a back plate which includes a first supporting plate supporting the pixel array part, a second supporting plate supporting the pad part, and an open part overlapping the bending part, a first protective film which includes a separation part overlapping the open part and is attached to a bottom of the back plate, and a second protective film which is attached to a top of the back plate and has a plate shape;
providing a cover window which includes a front part and a side wall provided on each of both sides of the front part;
stripping the second protective film from the back plate member and bonding a bottom of the flexible display panel to a top of the back plate;
pre-bending a bending part of the flexible display panel;
bonding the pixel array part of the flexible display panel to the front part of the cover window in a state where the bending part of the flexible display panel is pre-bent;
stripping the first protective film from the back plate member; and
additionally bending the bending part of the flexible display panel,
wherein the back plate member further comprises a third protective film attached to a bottom of the first protective film, the back plate member having a plate shape, and
the third protective film is stripped from a bottom of the first protective film, and the bending part of the flexible display panel is pre-bent.

12. The method of claim 11, wherein a bottom of the second supporting plate is disposed to face a bottom of the first supporting plate according to the additional bending of the bending part.

13. The method of claim 11, wherein the first supporting plate comprises:
a panel supporting part having a plate shape;
a guide projection protruding from an inner edge of the panel supporting part facing the second supporting plate; and
a rounding part provided on an inner surface of the guide projection facing the second supporting plate, and
the additionally bending of the bending part comprises bending the bending part of the flexible display panel in a curved shape according to bending guide by the rounding part.

14. A method of manufacturing a display apparatus, the method comprising:
providing a flexible display panel which includes a pixel array part, a pad part connected to the pixel array part, and a bending part between the pixel array part and the pad part;
providing a back plate member which includes a back plate which includes a first supporting plate supporting the pixel array part, a second supporting plate supporting the pad part, and an open part overlapping the bending part, a first protective film which includes a separation part overlapping the open part and is attached to a bottom of the back plate, and a second protective film which is attached to a top of the back plate and has a plate shape;
providing a cover window which includes a front part and a side wall provided on each of both sides of the front part;
stripping the second protective film from the back plate member and bonding a bottom of the flexible display panel to a top of the back plate;
pre-bending a bending part of the flexible display panel;
bonding the pixel array part of the flexible display panel to the front part of the cover window in a state where the bending part of the flexible display panel is pre-bent;
stripping the first protective film from the back plate member; and
additionally bending the bending part of the flexible display panel, wherein:
the first protective film further comprises a bridge connected between the first protection part and the second protection part which are separated from each other by the separation part, and
the bending part of the flexible display panel is pre-bent according to bending of the bridge.

* * * * *